US006794104B2

(12) United States Patent
Tashiro

(10) Patent No.: US 6,794,104 B2
(45) Date of Patent: Sep. 21, 2004

(54) LITHOGRAPHIC PRINTING PLATE PRECURSOR

(75) Inventor: Hiroshi Tashiro, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/370,694

(22) Filed: Feb. 24, 2003

(65) Prior Publication Data

US 2003/0164105 A1 Sep. 4, 2003

(30) Foreign Application Priority Data

Feb. 25, 2002 (JP) ....................................... 2002-048052
Jun. 28, 2002 (JP) ....................................... 2002-191051

(51) Int. Cl.[7] ............................ G03F 7/09; G03F 7/105
(52) U.S. Cl. .................. 430/138; 430/270.1; 430/271.1
(58) Field of Search ............................. 430/138, 270.1, 430/271.1, 302, 494, 944, 945

(56) References Cited

FOREIGN PATENT DOCUMENTS

| | | | | |
|---|---|---|---|---|
| EP | 1 057 622 | A2 * | 12/2000 | ............. B41C/1/10 |
| JP | 2938397 | B2 | 5/1997 | |
| JP | 2001-162961 | A | 6/2001 | |
| JP | 2001-205952 | A | 7/2001 | |

* cited by examiner

*Primary Examiner*—Barbara Gilliam
(74) *Attorney, Agent, or Firm*—Sughrue Mion, PLLC

(57) ABSTRACT

A lithographic printing plate precursor of the present invention comprises a water-resistant support, a hydrophilic layer and an image-forming layer, in this order, said hydrophilic layer comprising a fine particulate hydrophobicizing precursor and a hydrophilic binder polymer, and said image forming layer comprising a light-heat converting substance and a microcapsule encapsulating a hydrophobic substance, wherein the hydrophilic binder polymer is a composite material of a hydrophilic organic polymer and a polymer having a group including: at least one atom selected from a metal atom and semimetal atom; and an oxygen atom connecting with the at least one atom selected from a metal atom and semimetal atom.

12 Claims, No Drawings

LITHOGRAPHIC PRINTING PLATE PRECURSOR

FIELD OF THE INVENTION

The present invention relates to a lithographic printing plate precursor having a hydrophilic layer and an image-forming layer on a support, which can be on-press developed after scan exposure based on digital signals and ensures a long press life and less printing stain.

BACKGROUND OF THE INVENTION

The lithographic printing plate in general consists of a hydrophobic (ink-receptive) image area of repelling a fountain solution and accepting ink in the printing process and a hydrophilic image area of accepting the fountain solution. Such a lithographic printing plate has been heretofore manufactured by mask-exposing a PS plate comprising a hydrophilic support having provided thereon an ink-receptive photosensitive resin layer, through a lith film and then dissolving and thereby removing the photosensitive resin layer in the non-image area with a developer.

In recent years, a digitization technique of electronically processing, storing and outputting image information using a computer has been widespread, as a result, a computer-to-plate (CTP) technique of directly forming an image on a lithographic printing plate precursor without using a lith film by scanning high directivity light such as laser light based on digitized image information has been developed.

On the other hand, in the conventional production of a printing plate using a PS plate, a step of dissolving and removing the non-image area after exposure is indispensable and moreover, an after-treatment step of washing the developed printing plate with water or treating it with a rinsing solution containing a surfactant or with a desensitizing solution containing gum arabi, starch derivative or the like is usually necessary. These additive wet treatments are cumbersome and particularly in consideration of global environment recently arising as a great concern, improvement thereof is another matter to be solved in conventional techniques.

Under these circumstances, a simple and dry treatment or no treatment is more strongly demanded from both the environmental aspect and the aspect of more streamlining the process accompanying the digitization. In other words, a printing plate precursor for CTP system, which can be used as it is for printing without passing a wet treatment after the recording of an image, is being demanded.

As one of the methods for dispensing with the treatment step, a method called on-press development is known, where an exposed printing plate precursor is fixed on a cylinder of a press and a fountain solution and/or an ink are supplied while rotating the cylinder, thereby removing the non-image area in the image-forming layer of the printing plate precursor. Namely, this is a system of fixing a printing plate precursor as it is on a press after exposure and completing the treatment during the normal printing preparatory process.

With respect to such a lithographic printing plate precursor for CTP suitable for on-press development, for example, Japanese Patent 2,938,397 describes a lithographic printing plate where a photosensitive layer comprising a hydrophilic binder polymer having dispersed therein thermoplastic hydrophobic polymer fine particles is provided on a hydrophilic substrate. In this patent publication, it is stated that the on-press development can be performed by exposing the lithographic printing plate with an infrared laser to cause combination of the thermoplastic hydrophobic polymer fine particles due to heat and thereby form an image, then fixing the plate on a plate cylinder of a press, and supplying a fountain solution and/or an ink.

Also, JP-A-2001-162961 (the term "JP-A" as used herein means an "unexamined published Japanese patent application") describes a heat-sensitive lithographic printing plate precursor comprising a support having thereon a hydrophilic layer for forming an image, the hydrophilic layer comprising a hydrophilic binder polymer and a microcapsule enclosing hydrophobic components, and states that this printing plate precursor can be on-press developed.

JP-A-2001-205952 describes a lithographic printing plate precursor where a hydrophilic layer comprising a heat reactive compound is provided on a support and a heat-sensitive layer comprising a compound as the other party for the reaction of the heat reactive compound is further provided on the hydrophilic layer. In this lithographic printing plate precursor, the hydrophilic layer and the heat-sensitive layer undergo a chemical reaction when heated and are bound and therefore, the press life is improved.

However, lithographic printing plate precursors by conventional techniques are still insufficient in the printing performance such as staining resistance or press life.

SUMMARY OF THE INVENTION

An object of the present invention is to solve these problems, that is, to provide a lithographic printing plate precursor having good on-press developability, more improved in the staining resistance at printing, and ensuring sufficiently high strength of fine dot or line and a long press life.

(1) A lithographic printing plate precursor comprising a water-resistant support, a hydrophilic layer and an image-forming layer, in this order, said hydrophilic layer comprising a fine particulate hydrophobicizing precursor and a hydrophilic binder polymer, and said image forming layer comprising a light-heat converting substance and a microcapsule encapsulating a hydrophobic substance, wherein the hydrophilic binder polymer is a composite material of a hydrophilic organic polymer and a polymer having a group including: at least one atom selected from a metal atom and semimetal atom; and an oxygen atom connecting with the at least one atom selected from a metal atom and semimetal atom.

(2) The lithographic printing plate precursor as described in the item (1), wherein the hydrophilic organic polymer is (A) a hydrophilic organic polymer having a group capable of forming a hydrogen bond with the polymer having a group including: at least one atom selected from a metal atom and semimetal atom; and an oxygen atom connecting with the at least one atom selected from a metal atom and semimetal atom.

(3) The lithographic printing plate precursor as described in the item (1), wherein the hydrophilic organic polymer is (B) a hydrophilic organic polymer having a silane coupling group at the terminal, represented by the following formula (I):

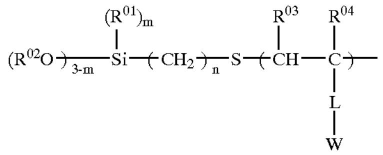

wherein $R^{01}$, $R^{02}$, $R^{03}$ and $R^{04}$ each independently represents a hydrogen atom or a hydrocarbon group having from 1 to 8 carbon atoms, m represents 0, 1 or 2, n represents an integer of 1 to 8, L represents a single bond or an organic linking group, W represents —$NHCOR^{05}$, —$CONH_2$, —$CON(R^{05})_2$, —$COR^{05}$, —OH, —$CO_2M$ or —$SO_3M$, and $R^{05}$ represents an alkyl group having from 1 to 8 carbon atoms, M represents a hydrogen atom, an alkali metal, an alkaline earth metal or an onium.

(4) The lithographic printing plate precursor as described in the item (1), which further comprises a surface graft hydrophilic layer on the hydrophilic layer, the surface graft hydrophilic layer comprising a polymer compound having a hydrophilic functional group, wherein the polymer compound is chemically bonded to the surface of the hydrophilic layer.

(5) The lithographic printing plate precursor as described in the item (4), wherein the polymer compound having a hydrophilic functional group is a linear polymer compound chemically bonded at the terminal of the polymer compound chain to the hydrophilic layer directly or through another binding polymer compound chemically bonded to the hydrophilic layer.

(6) The lithographic printing plate precursor as described in the item (1), wherein the polymer having a group including: at least one atom selected from a metal atom and semimetal atom; and an oxygen atom connecting with the at least one atom selected from a metal atom and semimetal atom is a polymer obtained by the hydrolytic polycondensation of at least one compound represented by the following formula (II):

$$(R^0)_kM^0(Y)_{z-k}$$

wherein $R^0$ represents a hydrogen atom, a hydrocarbon group or a heterocyclic group, Y represents a reactive group, $M^0$ represents a tri-, tetra-, quarter-, hepta- or hexa-valent metal or semimetal atom, z represents the valence number of $M^0$, and k represents 0, 1, 2, 3 or 4, provided that z-k is 2 or more.

(7) The lithographic printing plate precursor as described in the item (1), wherein the fine particulate hydrophobicizing precursor includes a self water-dispersible hydrophobic resin fine particle having hydrophilic surface.

(8) The lithographic printing plate precursor as described in the item (1), wherein the polymer having a group including; at least one atom selected from a metal atom and semimetal atom; and an oxygen atom connecting with the at least one atom selected from a metal atom and semimetal atom is a polymer having a group including: at least one semimetal atom; and an oxygen atom connecting with at least one semimetal atom.

(9) The lithographic printing plate precursor as described in the item (1), wherein the metal atom and semimetal atom is at least one of transition metals, rare earth metals, metals and semimetals of Groups III to V of the periodic table.

(10) The lithographic printing plate precursor as described in the item (1), wherein the metal atom and semimetal atom is at least one of Al, Si, Sn, Ge, Ti and Zr.

(11) The lithographic printing plate precursor as described in the item (1), wherein the metal atom and semimetal atom is at least one of Al, Si, Sn, Ti and Zr.

(12) The lithographic printing plate precursor as described in the item (1), wherein the metal atom and semimetal atom is Si.

As a result of extensive studies, the present invention provides a lithographic printing plate precursor having a layer structure comprising a hydrophilic layer and an image-forming layer, where a hydrophobicizing precursor contained in the hydrophilic layer causes selective hydrophobization and/or change in the form on the hydrophilic layer surface in the exposed area to strongly bind the hydrophilic layer and the negative image of the image-forming layer and thereby obtain a long press life and by using as the binder polymer of the hydrophilic layer a composite material of a hydrophilic organic polymer and a polymer having a group including: at least one atom selected from a metal atom and semimetal atom; and an oxygen atom connecting with the at least one atom selected from a metal atom and semimetal atom, the hydrophilic layer can be prevented from hydrophilic deterioration and more improvement of the staining resistance can be realized.

DETAILED DESCRIPTION OF THE INVENTION

The present invention is described in detail below.

Hydrophilic Layer

The hydrophilic layer of the present invention contains a hydrophobicizing precursor and a hydrophilic binder polymer. This hydrophilic layer is a substantially water-insoluble hardened film obtained by hardening a hydrophilic binder polymer having dispersed therein a hydrophobicizing precursor. The hydrophilic layer may contain, if desired, a crosslinking agent (or a hardening agent) or other polymers.

The hydrophobicizing precursor is a fine particle of a hydrophobic substance (a hydrophobicizing precursor of single structure) or a fine particle having a composite structure of a hydrophobic substance in the core part and a hydrophilic substance in the outside (a hydrophobicizing precursor of composite structure). This is a fine particle such that when heat is applied to the hydrophilic layer comprising a hydrophilic binder polymer having dispersed therein the hydrophobicizing precursor, the hydrophobic substance undergoes fusion, combining, reaction, bleeding, diffusion or the like and thereby the hydrophilic layer surface can be hydrophobized and/or changed in the form.

In the present invention, as an index for hydrophobicity, a solubility of 2 g or less in 100 g of water at 25° C. or an organic/inorganic ratio of 0.7 or more in the organic conceptual view is used. The organic conceptual view is a practical, simple and easy measure for showing the degree of organic or inorganic property of a compound and described in detail in Yoshio Tanaka, *Organic Conceptual View*, 1st ed., pp. 1–31, Sankyo Shuppan (1983).

Examples of the hydrophobicizing precursor of single structure include a fine particle of at least one member selected from a hydrophobic organic low molecular material, a hydrophobic thermoplastic polymer, a hydrophobic thermosetting polymer and a hydrophobic polymer having a heat reactive functional group (also called a heat reactive polymer).

The organic low molecular compound is preferably a hydrophobic solid or liquid organic compound having a melting point of 300° C. or less and a boiling point of 100° C. or more at an atmospheric pressure and having a molecular weight of 2,000 or less.

Examples of this organic low molecular compound include aliphatic or aromatic hydrocarbons having a high boiling point, carboxylic acids, alcohols, esters, ethers, amines, derivatives thereof, components for printing ink, and plasticizers.

Specific examples thereof include a fine particle dispersion of n-nonane, n-decane, n-hexadecane, octadecane, eicosane, caproic acid, capric acid, stearic acid, oleic acid, dodecyl alcohol, octyl alcohol, n-octadecyl alcohol, 2-octanol, lauryl alcohol, lauryl methyl ether, stearyl methyl ether, stearylamide, oils and fats such as linseed oil, soybean oil, poppy oil and safflower oil, plasticizers such as tributyl phosphate, tricresyl phosphate, dibutyl phthalate, butyl laurate and dioctyl phthalate, waxes such as carnauba wax, castor wax, microcrystalline wax, paraffin wax, shellac wax, palm wax and beeswax, low molecular weight polyethylene, and metal salts of a long-chain fatty acid, such as silver behenate, calcium stearate and magnesium palmitate.

Examples of the organic polymer compound include a thermoplastic polymer, a thermosetting polymer and a polymer having a heat reactive functional group. When heat is applied, the fine particle of this polymer (also called fine particulate polymer or polymer fine particle) undergoes fusion or reaction to cause combining of fine particles with each other. In the image-forming layer, these fine particulate polymers can be used individually or in combination of two or more thereof.

The fine particulate thermoplastic polymer for use in the present invention is preferably a water-insoluble resin fine particle having an average particle size of 0.005 to 2.0 μm and a thermal property that the glass transition point is from 50 to 180° C., more preferably having an average particle size of 0.01 to 1.5 μm and a glass transition point of 60 to 160° C. The mass weight average molecular weight (Mw) of the resin forming this fine particle is preferably $3\times10^3$ to $1\times10^6$, more preferably from $5\times10^3$ to $8\times10^5$. By using a resin having physical properties within these ranges, the effect of the present invention, namely, hydrophilicity (staining resistance at printing) and improvement in the adhesion to the image area can be successfully obtained.

Examples of this resin include resins described in Yuji Harasaki et al, *Saishin Binder Gijutsu Binran*(*Handbook of Newest Binder Technology*), Sogo Gijutsu Center (1985), Koichi Nakamura, *Kirokuzairyo Yo Binder no Jissai Gijutsu* (*Practical Technology of Binder for Recording Material*), CMC (1985), *Acryl Jushi no Gosei•Sekkei to Shin Yoto Kaihatsu* (*Synthesis•Design and Development of New Usage of Acrylic Resin*), edited by Chubu Keiei Kaihatsu Center Shuppan Bu (1985), and *Research Disclosure*, No. 33303 (January, 1992).

Specific examples thereof include olefin polymers and copolymers (e.g., polyethylene, polypropylene, polyisobutylene, ethylene-vinyl acetate copolymer, ethylene-acrylate copolymer, ethylene-methacrylate copolymer, ethylene-methacrylic acid copolymer, cycloalkene copolymer, vinyl cycloalkane copolymer), vinyl chloride polymers and copolymers (e.g., polyvinyl chloride, vinyl chloride-vinyl acetate copolymer), vinylidene chloride copolymers, vinyl alkanoate polymers and copolymers, allyl alkanoate polymers and copolymers, polymers and copolymers of styrene and derivatives thereof (e.g., butadiene-styrene copolymer, isobutylene-styrene copolymer, styrene-methacrylate copolymer, styrene-acrylate copolymer), acrylonitrile copolymers, methacrylonitrile copolymers, alkyl vinyl ether copolymers, acrylic acid ester polymers and copolymers, methacrylic acid ester polymers and copolymers, itaconic acid diester polymers and copolymers, maleic anhydride copolymers, acrylamide copolymers, methacrylamide copolymers, phenolic resins, alkyd resins, polycarbonate resins, ketone resins, polyester resins, hydroxyl group- and carboxyl group-modified polyester resins, butyral resins, polyvinyl acetal resins, urethane resins, rosin resins, hydrogenated rosin resins, petroleum resins, hydrogenated petroleum resins, maleic acid resins, terpene resins, hydrogenated terpene resins, cyclized rubber-methacrylic acid ester copolymers, cyclized rubber-acrylic acid ester copolymers, copolymers containing a heterocyclic ring having no nitrogen atom (examples of the heterocyclic ring include furan ring, tetrahydrofuran ring, thiophene ring, dioxane ring, dioxofuran ring, lactone ring, benzofuran ring, benzothiophene ring and 1,3-dioxetan ring), and epoxy resins.

These resins may be used individually or in combination of two or more thereof.

The thermoplastic polymer can be formed into a fine particle by a conventionally known method such as a method of forming fine particles by a polymerization granulation reaction (e.g., emulsion polymerization, suspension polymerization) using respective corresponding resin monomers, a method of forming the resin into fine particles by a wet. or dry mechanical process, and a method of dissolving the resin in a water-immiscible solvent and emulsification dispersing the solution in an aqueous phase. These methods are specifically described, for example, in *Kobunshi Biryushi no Saishin Gijutsu to Yoto Tenkai* (*Newest Technology and Development of Usage of Polymer Fine Particle*), CMC (1997), and *Saishin Funtai no Zairyo Sekkei* (*Newest Design of Materials for Powder*), Technosystem (1988).

Examples of the fine particulate thermosetting polymer for use in the present invention include resins having a phenol skeleton, urea-base resins (for example, a resin obtained by resinifying urea or a urea derivative such as methoxymethylated urea with an aldehyde such as formaldehyde), melamine-based resins (for example, a resin obtained by resinifying melamine or a derivative thereof with an aldehyde such as formaldehyde), alkyd resins, unsaturated polyester resin, polyurethane resins and epoxy resins.

Examples of the resin having. a suitable phenol skeleton include phenol, phenolic resins obtained by resinifying cresol or the like with an aldehyde such as formaldehyde, hydroxystyrene resins, methacrylamide or acrylamide resins having a phenol skeleton, such as N-(p-hydroxyphenyl) methacrylamide, and methacrylate or acrylate resins having a phenol skeleton, such as p-hydroxyphenyl methacrylate. Among these, preferred are resins having a phenol skeleton, melamine resins, urea resins and epoxy resins.

This thermosetting polymer can be formed into a fine particle in the same manner as the above-described formulation of a fine particle of the thermoplastic resin.

Examples of the heat reactive functional group in the polymer fine particle having a heat reactive functional group for use in the present invention include an ethylenically unsaturated group of performing a polymerization reaction (such as acryloyl group, methacryloyl group, vinyl group and allyl group), an isocyanate group of performing an addition reaction or a block form thereof and a functional group having an active hydrogen atom as the other party of the reaction (such as amino group, hydroxyl group and carboxyl group), an epoxy group of performing an addition reaction and an amino, carboxyl or hydroxyl group as the other party of the reaction, a carboxyl group of performing a condensation reaction and a hydroxyl or amino group, and an acid anhydride of performing a ring-opening addition reaction and an amino or hydroxyl group. However, as long as a chemical bond is formed, the functional group may perform any reaction.

This functional group may be introduced into the polymer fine particle at the polymerization or may be introduced using a polymer reaction after the polymerization.

In the case of introducing the functional group at the polymerization, a monomer having the functional group is preferably emulsion polymerized or suspension polymerized. Specific examples of the monomer having the functional group include allyl methacrylate, allyl acrylate, vinyl methacrylate, vinyl acrylate, glycidyl methacrylate, glycidyl acrylate, 2-vinyloxyethyl methacrylate, 2-isocyanate ethyl methacrylate or a block isocyanate thereof with an alcohol or the like, 2-isocyanate ethyl acrylate or a block isocyanate thereof with an alcohol or the like, 2-aminoethyl methacrylate, 2-aminoethyl acrylate, 4-aminomethylstyrene, 4-vinyloxystyrene, 2-hydroxyethyl methacrylate, 2-hydroxyethyl acrylate, acrylic acid, methacrylic acid, maleic anhydride, bifunctional acrylate, bifunctional methacrylate and compounds described in JP-A-2001-293971, paragraphs [0018] to [0035], however, the present invention is not limited thereto.

At the emulsion polymerization or suspension polymerization, a monomer copolymerizable with the above-described monomer and having no heat reactive functional group may be present together. Examples of this monomer include styrene, alkyl acrylate, alkyl methacrylate, acrylonitrile and vinyl acetate, however, as long as it is a monomer not having a heat reactive functional group, the monomer is not limited thereto.

Examples of the polymer reaction used in the case of introducing the heat reactive functional group after the polymerization include the polymer reaction described in WO96-34316.

The solidification temperature of the polymer fine particle having this heat reactive functional group is preferably 70° C. or more and in view of aging stability, more preferably 100° C. or more.

The resin fine particle of the hydrophobicizing precursor includes a self water-dispersible hydrophobic resin fine particle with the resin fine particle surface being hydrophilic.

Suitable examples of the self water-dispersible hydrophobizing resin fine particle include (1) a resin fine particle obtained by dispersing a raw material resin having a lipophilic resin moiety and a hydrophilic group moiety within the molecule in water by the phase inversion emulsification method without using an emulsifier or a protective colloid described in JP-A-3-221137 and JP-A-5-66600, (2) a fine particle having a core/shell structure with the core part being composed of a lipophilic resin and the shell part being composed of a resin comprising a hydrophilic component, and (3) a microcapsule fine particle enclosing a hydrophobic substance and obtained by protecting the surface thereof with a hydrophilic wall material.

This self water-dispersible hydrophobizing resin fine particle is uniformly dispersed with ease in a coating dispersion solution for forming a hydrophilic layer and also in the hydrophilic layer formed after coating, this fine particle is present in a uniformly dispersed state without causing aggregation of particles with each other, whereby the effect of the present invention is more enhanced.

In the above-described single resin fine particle of (1) or fine particle having a composite structure of (2) and (3), the resin component showing hydrophilicity contains a hydrophilic group described below in the polymer component, where the hydrophilic group is bonded directly to the polymer main chain or present in the substituent component on the side chain.

Examples of the hydrophilic group include —OH group, —COOH group, —SH group, —$SO_3H$ group, —$PO_3H_2$ group, —$OPO_3H$ group, —P(═O)(OH)($R^{01}$) group, —OP(═O)(OH)($R^{01}$) group, —N($R^{01}$)CO($R^{01}$) group, —N($R^{01}$)$SO_2$($R^{01}$) group, —CON($R^{02}$)($R^{03}$) group, —$SO_2$N($R^{02}$)($R^{03}$) group, —$SO_2NHSO_2$($R^{01}$) group, —N($R^{02}$)($R^{03}$) group, a 5- or 6-membered heterocyclic group containing at least one nitrogen atom, a heterocyclic group forming a condensed ring structure with the 5- or 6-membered heterocyclic ring, and a cation group. In the constituent repeating unit, one of these hydrophilic groups may be contained or two or more thereof may be contained. In the case where the resin showing hydrophilicity is a copolymer, two or more copolymerization components may be contained.

The substituent ($R^{01}$) represents an aliphatic group having from 1 to 12 carbon atoms, which may be substituted, or an aryl group having from 6 to 14 carbon atoms, which may be substituted. ($R^{02}$) and ($R^{03}$) may be the same or different and each represents a hydrogen atom, an aliphatic group having from 1 to 18 carbon atoms, which may be substituted, or an aryl group having from 6 to 14 carbon atoms, which may be substituted. ($R^{02}$) and ($R^{03}$) may form a ring and when a ring is formed, ($R^{02}$) and ($R^{03}$) represent an atomic group forming the ring.

Examples of the aliphatic group having from 1 to 12 carbon atoms of the substituent ($R^{01}$) include a linear or branched alkyl group having from 1 to 12 carbon atoms (e.g., methyl, ethyl, propyl, butyl, pentyl, hexyl, heptyl, octyl, nonyl, decyl, undecyl, dodecyl), a linear or branched alkenyl group having from 2 to 12 carbon atoms (e.g., vinyl, propenyl, butenyl, pentenyl, hexenyl, octenyl, decenyl, dodecenyl), a linear or branched alkynyl group having from 2 to 12 carbon atoms (e.g., ethynyl, propynyl, butynyl, pentynyl, hexynyl, octynyl, decynyl, dodecynyl), and an alicyclic group having from 5 to 10 carbon atoms (e.g., cyclopentyl, cyclohexyl, cyclooctyl, cyclodecyl, cyclohexenyl, cyclooctenyl, tricyclodecyl, tricyclodecenyl, isobornyl, adamantyl).

Examples of the aliphatic group having from 1 to 18 carbon atoms of the substituent ($R^{02}$) include a linear or branched alkyl group having from 1 to 18 carbon atoms (e.g., methyl, ethyl, propyl, butyl, pentyl, hexyl, heptyl, octyl, nonyl, decyl, undecyl, dodecyl, tridecyl, tetradecyl, hexadecyl, octadecyl), a linear or branched alkenyl group having from 2 to 18 carbon atoms (e.g., vinyl, propenyl, butenyl, pentenyl, hexenyl, octenyl, decenyl, dodecenyl, tetradecenyl, hexadecenyl, octadecenyl), a linear or branched alkynyl group having from 2 to 18 carbon atoms (e.g., ethynyl, propynyl, butynyl, pentynyl, hexynyl, octynyl, decynyl, dodecynyl, octadecynyl), and an alicyclic group having from 5 to 10 carbon atoms (e.g., cyclopentyl, cyclohexyl, cyclooctyl, cyclodecyl, cyclohexenyl, cyclooctenyl, tricyclodecyl, tricyclodecenyl, isobornyl, adamantyl).

Examples of the aryl group having from 6 to 14 carbon atoms of the substituents ($R^{01}$) to ($R^{03}$) include a phenyl group, a naphthyl group, a dihydronaphthyl group, a tetranyl group, an indenyl group, an indanyl group, a benzocyclobutenyl group, a benzocycloheptenyl group and anthranyl group.

Examples of the substituent which may be substituted to these hydrocarbon groups. include the substituents described above as the hydrophilic group, a cyano group, a halogen atom (e.g., fluorine, chlorine, bromine, iodine), —$OR^{04}$ group, —$SR^{04}$ group, —$COOR^{04}$ group, —$OCOR^{04}$ group, —$SO_2R^{04}$ group, —$COR^{04}$ group, —$NHCONHR^{04}$ group, —Si($R^{05}$)($R^{06}$)($R^{07}$) group, an alkyl group, an alkenyl group, an alkynyl group, an alicyclic group, an aryl group and a heterocyclic group.

The substituents ($R^{04}$) to ($R^{07}$) have the same meaning as ($R^{01}$). Examples of the alkyl group, alkenyl group, alkynyl group, alicyclic group and aryl group are the same as those of respective substituents of ($R^{01}$).

Examples of the heterocyclic group include a 5- or 6-membered heterocyclic group containing at least one atom selected from an oxygen atom, a sulfur atom and a nitrogen atom, and a heterocyclic group having a polycyclic structure containing these heterocyclic groups. The heterocyclic group may have a substituent and examples of the substituent are the same as those described above for the substituent which may be substituted to the hydrocarbon group.

Specific examples of the heterocyclic group include heterocyclic groups derived from heterocyclic rings such as tetrahydrofuran, dihydrofuran, pyrrole, pyrroline, pyrrolidine, pyrazole, pyrazoline, pyrazolidine, imidazole, imidazoline, imidazolidine, triazole, triazoline, triazolidine, tetrazole, tetrazoline, tetrazolidine, thiophene, dihydrothiophene, tetrahydrothiophene, isooxazole, isooxazoline, isooxazolidine, oxazole, oxazoline, oxazolidine, isothiazole, isothiazoline, isothiazolidine, thiazole, thiazoline, thiazolidine, pyridine, hydropyridine, piperidine, pyridazine, hydropyridazine, pyrimidine, pyrazine, piperazine, pyran, hydropyran, thiopyran, hydrothiopyran, oxazine, morpholine, azepine, hydroazepine, azocine, azecine, diazepine, diazocine, hydroazocine, diazonine, diazecine, oxepine, hydrooxepine, oxocine, oxonine, oxecine, thiepine, thiocine, hydrothiocine, thionine, thiecine, dithiepine, dithiocine, dithionine, dithiecine, oxazepine, thiazepine, oxathiepine, hydrooxathiepine, oxathiocine, hydrooxathiocine, isoindole, indoline, indole, isoindoline, carbazole, indazole, benzimidazole, hydrobenzimidazole, benzotriazole, isobenzofuran, dibenzofuran, hydrobenzofuran, benzoxazole, benzothiophene, benzodithiol, hydrobenzoxazole, benzisoxazole, benzothiazole, benzisothiazole, benzoxathiol, quinoline, isoquinoline, acridine, phenanthridine, quinazoline, phenazine, benzopyran, xanthene, benzothiopyran, hydrobenzopyran, benzoxazine, benzothiazine, thioxanthene, phenoxazine, phenothiazine, benzoazepine, benzodiazepine, pyrrolidine, quinolizine, quinolidizine, indolizine, pyrrolididine, purine, isochroman, chroman, bipyridine, bithiophene, quinuclidine and piperazine.

The cation group as the hydrophilic group is a group of forming an onium salt and examples thereof include —$N^+(R^{08})_3$, —$S^+(R^{09})_2$, —$J^+(R^{09})$ and —$P^+(R^{09})_3$.

The substituent ($R^{08}$) represents a hydrogen atom, a hydrocarbon group or a heterocyclic group and the three substituents may be the same or different. The substituent ($R^{09}$) represents a hydrocarbon group or a heterocyclic group and when two or three substituents are substituted, these may be the same or different.

Preferred examples of the hydrocarbon group of the substituents ($R^{08}$) and ($R^{09}$) include a linear or branched alkyl group having from 1 to 12 carbon atoms, which may be substituted (such as methyl group, ethyl group, propyl group, butyl group, pentyl group, hexyl group, heptyl group, octyl group, nonyl group, decyl group and dodecyl group; examples of the group which can be substituted to these groups include a halogen atom (e.g., chlorine, fluorine, bromine), a hydroxy group, a thiol group, a carboxy group, a sulto group, a cyano group, an epoxy group, —$OR^{010}$ group (wherein $R^{010}$ represents a hydrocarbon group such as methyl group, ethyl group, propyl group, butyl group, hexyl group, heptyl group, octyl group, decyl group, propenyl group, butenyl group, hexenyl group, octenyl group, 2-hydroxyethyl group, 3-chloropropyl group, 2-cyanoethyl group, N,N-dimethylaminoethyl group, 2-bromoethyl group, 2-(2-methoxyethyl)oxyethyl group, 2-methoxycrbonylethyl group, 3-carboxypropyl group and benzyl group), —$OCOR^{010}$ group, —$COOR^{010}$ group, —$COR^{010}$ group, —$N(R^{011})(R^{011})$ (wherein $R^{011}$ represents a hydrogen atom or the same meaning as $R^{010}$ and these $R^{011}$ may be the same or different), —$NHCONHR^{010}$ group, —$NHCOOR^{010}$ group, —$Si(R^{010})_3$ group, —$CONHR^{011}$ group and —$NHCOR^{010}$ group, and a plurality of these substituents may be substituted in the alkyl group)}, a linear or branched alkenyl group having from 2 to 12 carbon atoms, which may be substituted (such as vinyl group, propenyl group, butenyl group, pentenyl group, hexenyl group, octenyl group, decenyl group and dodecenyl group; examples of the group which can be substituted to these groups are the same as those described above for the group which can be substituted to the alkyl group and a plurality of the substituents may be substituted), an aralkyl group having from 7 to 14 carbon atoms (such as benzyl group, phenethyl group, 3-phenylpropyl group, naphthylmethyl group and 2-naphthylethyl group; examples of the group which can be substituted to these groups are the same as those described above for the group which can be substituted to the alkyl group and a plurality of substituents may be substituted), an alicyclic group having from 5 to 10 carbon atoms, which may be substituted (such as cyclopentyl group, cyclohexyl group, 2-cyclohexylethyl group, 2-cyclopentylethyl group, norbornyl group and adamantyl group; examples of the group which can be substituted to these groups are the same as those described above for the group which can be substituted to the alkyl group and a plurality of substituents may be substituted), and an aryl group having from 6 to 12 carbon atoms (such as phenyl group and naphthyl group: examples of the substituent include those described above for the group which can be substituted to the alkyl group and a plurality of substituents may be substituted).

Preferred examples of the heterocyclic group of the substituents ($R^{08}$) and ($R^{09}$) include a heterocyclic group containing at least one atom selected from a nitrogen atom, an oxygen atom and a sulfur atom, which may be condensed (examples of the heterocyclic ring include a pyran ring, a furan ring, a thiophene ring, a morpholine ring, a pyrrole ring, a thiazole ring, an oxazole ring, a pyridine ring, a piperidine ring, a pyrrolidone ring, a benzothiazole ring, a benzoxazole ring, a quinoline ring and a tetrahydrofuran ring, and these rings each may contain a substituent; examples of the substituent are the same as those described above for the substituent in the alkyl group and a plurality of substituents may be substituted).

The lipophilic moiety of the self water-dispersible resin fine particle is described below. The resin containing a lipophilic moiety may be any resin as long as it is insoluble in water and has a glass transition point of 50 to 180° C. Specific examples thereof include those described above for the thermoplastic resin fine particle and the thermosetting resin fine particle.

Preferred examples thereof include (meth)acrylate resin, styrene ring, vinyl ester resin, epoxy resin, urethane resin, phenolic resin, vinyl ether resin, vinyl ketone resin, olefin resin and substituted (meth)acrylamide copolymer resin.

Examples of the monomer corresponding to the polymer component of these resins include the compounds described in JP-A-2001-47755, paragraphs [0086] to [0090].

The self water-dispersible hydrophobic resin containing a hydrophilic component and a lipophilic component in the same resin may be synthesized by a polymerization reaction of a monomer containing a hydrophilic group and a lipophilic monomer or by a conventionally known polymer reaction to introduce a hydrophilic group into a lipophilic resin.

The polymer reaction may be performed by a method described, for example, Teiji Tsuruta (compiler), *Kobunshi Kino Zairyo Series Dai* 2 *Kan, Kobunshi no Gosei to Hanno* (2) (*Polymer Functional Material Series, Vol.* 2, *Synthesis and Reaction of Polymer* (2)), Chap. 7, Kyoritsu Shuppan (1991).

Depending on the case, the lipophilic resin moiety in the raw material resin molecule for use in the phase inversion emulsification method may be a copolymer of the above-described polymerizable monomer and a polymerizable unsaturated group-containing oligomer. Examples of the polymerizable unsaturated group-containing oligomer include vinyl-modified polyester, vinyl-modified polyurethane, vinyl-modified epoxy resin and vinyl-modified phenolic resin. The polymer reaction for introducing a vinyl group is performed by the method described in the above-described publication.

By copolymerizing at least one member selected from these monomers and polymerizable unsaturated group-containing oligomers with the monomer having a hydrophilic group according to the phase inversion emulsification method, a raw material resin of the self water-dispersible resin fine particle is obtained. This raw material resin preferably has a mass average molecular weight of 500 to 500,000 and a number average molecular weight of 200 to 60,000.

This resin may further have a heat reactive functional group which is described above.

In addition to those, examples of the self-dispersible resin fine particle for use in the present invention include urethane resin such as urethane resin dispersion disclosed in JP-A-1-287183, and epoxy resin such as various epoxy compounds described in JP-A-53-1228, JP-A-55-3481 and JP-A-55-9433.

In the fine particle, the above-described hydrophobic organic low molecular compound may also be enclosed. The hydrophobic organic compound can be enclosed in the resin fine particle by adding the compound in an organic solvent having dissolved therein the hydrophobizing resin at the synthesis of the resin fine particle and performing the inverse phase emulsification The solidification temperature of the self water-dispersible hydrophobizing resin fine particle is preferably 70° C. or more and in view of aging stability, more preferably 100° C. or more.

The self water-dispersible fine particle having a core-shell structure for use in the present invention is a heterophase structure fine particle called a composite fine particle or simply a core-shell fine particle, where the core part is a fine particle of a hydrophobic polymer obtained by emulsification (including phase inversion emulsification) or dispersion polymerization, which is softened or melted under the action of heat, and a polymerized layer of a hydrophilic polymer is formed to embrace the fine particle. The polymerized layer of a hydrophilic polymer is formed by adding a hydrophilic monomer in a dispersion solution of core particle (seed) and polymerizing the hydrophilic monomer on the surface of the core particle.

The lipophilic resin moiety constituting the core part comprises at least one resin selected from the above-described thermoplastic resins and thermosetting resins. The hydrophilic resin forming the shell phase may be formed, other than the resin having at lest one hydrophilic group selected from the hydrophilic groups described above, by aggregating and attaching a sol-like fine particle dispersion having a very high hydrophilicity, such as silica fine particle or alumina fine particle, to the surface of the core fine particle or may be a hydrophilic gel formed by a sol-gel converting substance (for example, (semi)metal-containing resin which is described later).

In addition, various epoxy resins having a core-shell structure described, for example, in JP-A-5-9421 are suitable as the self water-dispersible resin fine particle for use in the present invention.

Also in the case of the self water-dispersible resin fine particle having a core-shell structure, similarly to the resin fine particle by the phase inversion emulsification, a hydrophilic compound may be adsorbed to the resin surface or a hydrophobic organic compound may be enclosed in the resin. Suitable examples of the compound which is adsorbed or enclosed include the same compounds described for the resin fine particle by the phase inversion emulsification.

The average particle size of the hydrophobizing resin fine particle for use in the present invention is preferably from 0.01 to 20 $\mu$m, more preferably from 0.05 to 2.0 $\mu$m, most preferably from 0.1 to 1.0 $\mu$m. Within this range, good resolution and aging stability can be obtained.

The hydrophobic substance contained in the microcapsule fine particle (hereinafter simply referred to as a microcapsule) may be an organic low molecular compound described above with respect to the hydrophobicizing precursor of single structure, but is preferably a compound having a heat reactive group. The microcapsule may be constructed such that microcapsules can react with each other through the heat reactive group, or in the case of containing a hydrophilic resin described: later or a low molecular compound as another additive in the image-forming layer, such that the heat reactive group can react with the hydrophilic resin or low molecular compound. Also, a construction such that two or more kinds of microcapsules have respective heat reactive groups of causing a heat reaction therebetween and microcapsules can react with each other may be employed. Furthermore, the microcapsule of the present invention may have a structure where a compound having a heat reactive group is enclosed in the microcapsule, where the compound is contained in the outer wall of the microcapsule or where the compound is enclosed in the microcapsule and at the same time, contained in the outer wall of the microcapsule.

Examples of the heat reactive group include an ethylenically unsaturated group of performing a polymerization reaction (for example, an acryloyl group, a methacryloyl group, a vinyl group and an allyl group), an isocyanate group of performing an addition reaction or a block form thereof and a functional group having an active hydrogen atom as the other party of the reaction (e.g., amino group, hydroxyl group, carboxy group), an epoxy group of performing an addition reaction and an amino, carboxy or hydroxyl group as the other party of the reaction, a carboxy group of performing a condensation reaction and a hydroxyl or amino group, an acid anhydride of performing a ring-opening addition reaction and an amino or hydroxyl group, and a diazonium group of thermally decomposing to react with a hydroxy group or the like. However, as long as a chemical bond is formed, the functional group may perform any reaction.

Examples of the compound having a heat reactive group include ethylenically unsaturated group compounds (compounds well-known as a polymerizable monomer, prepolymer or oligomer, such as trimethylolpropane diacrylate, trimethylolpropane triacrylate, triacrylate of pentaerythritol, and diacrylate or pentaacrylate of dipentaerythritol, and polymers having an allyl group on the side chain, such as copolymer of allyl methacrylate and alkyl methacrylate) described in JP-A-2001-293971, epoxy compounds, isocyanate compounds, amines, alcohols or phenols, carboxylic acids or acid anhydrides, compounds containing a protected heat reactive group which is deprotected by thermal decomposition (for example, phenol block tolylene diisocyanate) described in JP-A-2001-305723, epoxy resins (for example, epoxy resins such as Epicote 1001, Epicote 1003 and Epicote 1004 produced by Yuka Shell Epoxy, and novolak epoxy resin and methacrylic acid/glycidyl methacrylate copolymer produced by Sumitomo Chemical Co., Ltd.) and phenolic resins such as thermo-setting novolak resin described in JP-A-2002-002135 and JP-A-2002-046361, and compounds or polymers having a vinyloxy group described in JP-A-2002-029162 and JP-A-2002-036745.

The wall material of the microcapsule for use in the present invention is preferably polyurea, polyurethane, polyester, polycarbonate, polyamide or a mixture thereof, more preferably polyurea or polyurethane. As described above, a compound having a heat reactive group may be introduced into the outer wall of the microcapsule.

The microcapsule enclosing a compound having a heat reactive group can be produced by a method appropriately selected from various methods described, for example, in JP-A-2001-293971, paragraph [0036]. However, the production method of the microcapsule is not limited thereto.

The microcapsule of the present invention may be a microcapsule as described in JP-A-2001-27740 where the outer wall is ruptured by heat used for the image formation, or a microcapsule as described in JP-A-2001-277742 where the outer wall is not ruptured by heat used for the image formation. In the case of a microcapsule where the outer wall is not ruptured by heat, as described in JP-A-2001-277742, the outer wall is three-dimensionally crosslinked and a solvent for swelling the outer wall is added to the microcapsule dispersed solvent so that a heat reactive compound can be present in the Outer wall or on the microcapsule surface.

The hydrophilic binder polymer for use in the present invention is a composite material of a hydrophilic organic polymer and a polymer having a group including: at least one atom selected from a metal atom and semimetal atom; and an oxygen atom connecting with the at least one atom selected from a metal atom and semimetal atom (hereinafter sometimes referred to as a "(semi)metal-containing polymer). Examples of the hydrophilic organic polymer include (A) a hydrophilic organic polymer having a group capable of forming a hydrogen bond with the (semi)metal-containing polymer and (B) a hydrophilic organic polymer having a silane coupling group at the terminal represented by the following formula (I). Among these, the hydrophilic organic polymer (B) is preferred.

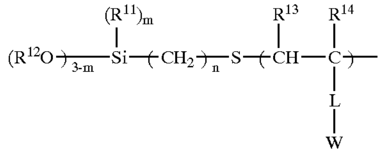

[wherein $R^{11}$, $R^{12}$, $R^{13}$ and $R^{14}$ each independently represents a hydrogen atom or a hydrocarbon group having from 1 to 8 carbon atoms, m represents 0, 1 or 2, n represents an integer of 1 to 8, L represents a single bond or an organic linking group, W represents —$NHCOR^{15}$, —$CONH_2$, —$CON(R^{15})_2$, —$COR^{15}$, —OH, —$CO_2M$ or —$SO_3M$, $R^{15}$ represents an alkyl group having from 1 to 8 carbon atoms, and M represents a hydrogen atom, an alkali metal, an alkaline earth metal or an onium].

The "composite material of a (semi)metal-containing polymer and a hydrophilic organic polymer" includes a sol-like substance and a gel-like substance. The (semi) metal-containing polymer is a polymer mainly containing a bond composed of "oxygen atom-metal atom or semimetal atom-oxygen atom". The (semi)metal-containing polymer may contain both a metal atom and a semimetal atom. The (semi)metal-containing polymer is preferably a polymer containing only a semimetal atom, or a polymer containing a semimetal atom and a metal atom.

The (semi)metal-containing polymer is preferably a polymer obtained by the hydrolytic polycondensation of a compound represented by the following formula (II). The hydrolytic polycondensation is a reaction of repeating hydrolysis and condensation of a reactive group under acidic or basic conditions, thereby performing the polymerization.

$$(R^{20})_k M^0 (Y)_{z-k} \qquad \text{Formula (II):}$$

[wherein $R^{20}$ represents a hydrogen atom, a hydrocarbon group or a heterocyclic group, Y represents a reactive group, $M^0$ represents a tri-, tetra-, quarter-, hepta- or hexa-valent metal or semimetal, z represents the valence number of $M^0$, and k represents 0, 1, 2, 3 or 4, provided that z-k is 2 or more].

These compounds are used individually or in combination of two or more thereof for the production of a (semi)metal-containing polymer.

The (semi)metal compound represented by formula (II) is described in detail below.

Preferred examples of the hydrocarbon group and the heterocyclic group of $R^{20}$ in formula (II) are the same as those described above for the substituent ($R^{08}$).

Preferred examples of the reactive group Y include a hydroxy group, a halogen atom (fluorine, chlorine, bromine or iodine), —$OR^{21}$ group, —$OCOR^{22}$ group, —$CH(COR^{23})(COR^{24})$ group, —$CH(COR^{23})(COOR^{24})$ group and —$N(R^{25})(R^{26})$ group.

In the —$OR^{21}$ group, $R^{21}$ represents an aliphatic group having from 1 to 10 carbon atoms, which may be substituted (such as methyl group, ethyl group, propyl group, butyl group, pentyl group, hexyl group, heptyl group, octyl group, nonyl group, decyl group, propenyl group, butenyl group, heptenyl group, hexenyl group, octenyl group, decenyl group, 2-hydroxyethyl group, 2-hydroxypropyl group, 2-methoxyethyl group, 2-(methoxyethyloxy)ethyl group, 2-(N,N-diethylamino)ethyl group, 2-methoxypropyl group, 2-cyanoethyl group, 3-methyloxypropyl group, 2-chloroethyl group, cyclohexyl group, cyclopentyl group, cyclooctyl group, chlorocyclohexyl group, methoxycyclohexyl group, benzyl group, phenethyl group, dimethoxybenzyl group, methylbenzyl group and bromobenzyl group).

In the —$OCOR^{22}$ group, $R^{22}$ represents the same aliphatic group as $R^{21}$ or an aromatic group having from 6 to 12 carbon atoms, which may be substituted (examples of the aromatic group include those described above for the aryl group in $R^{20}$).

In the —$CH(COR^{23})(COR^{24})$ group and —$CH(COR^{23})(COOR^{24})$ group, $R^{23}$ represents an alkyl group having from 1 to 4 carbon atoms (such as methyl group, ethyl group, propyl group and butyl group) or an aryl group (such as phenyl group, tolyl group and xylyl group) and $R^{24}$ represents an alkyl group having from 1 to 6 carbon atoms (such as methyl group, ethyl group, propyl group, butyl group, pentyl group and hexyl group), an aralkyl group having from 7 to 12 carbon atoms (such as benzyl group, phenethyl group, phenylpropyl group, methylbenzyl group, methoxybenzyl group, carboxybenzyl group and chlorobenzyl group) or an aryl group (such as phenyl group, tolyl group, xylyl group, mesityl group, methoxyphenyl group, chlorophenyl group, carboxyphenyl group and diethoxyphenyl group).

In the —N($R^{25}$)($R^{26}$) group, $R^{25}$ and $R^{26}$ may the same or different and each preferably represents a hydrogen atom or an aliphatic group having from 1 to 10 carbon atoms, which may be substituted (examples of the aliphatic group include those described above for $R^{21}$ of the —$OR^{21}$ group). More preferably, the total number of carbon atoms of $R^{25}$ and $R^{26}$ is 12 or less.

Preferred examples of the (semi)metal $M^0$ include transition metals, rare earth metals, and metals and semimetals of Groups III–V of the periodic table. Among these, preferred are Al, Si, Sn, Ge, Ti and Zr, more preferred are Al, Si, Sn, Ti and Zr, still more preferred is Si.

Specific examples of the (semi)metal compound represented by formula (II) include the followings, however, the present invention is not limited thereto:

methyltrichlorosilane, methyltribromosilane, methyltrimethoxysilane, methyltriethoxysilane, methyltriisopropoxysilane, methyltri-tert-butoxysilane, ethyltrichlorosilane, ethyltribromosilane, ethyltrimethoxysilane, ethyltriethoxysilane, ethyltriisopropoxysilane, ethyltri-tert-butoxysilane, n-propyltrichlorosilane, n-propyltribromosilane, n-propyltrimethoxysilane, n-propyltriethoxysilane, n-propyltriisopropoxysilane, n-propyltri-tert-butoxysilane, n-hexyltrichlorosilane, n-hexyltribromosilane, n-hexyltrimethoxysilane, n-hexyltriethoxysilane, n-hexyltriisopropoxysilane, n-hexyltri-tert-butoxysilane, n-decyltrichlorosilane, n-decyltribromosilane, n-decyltrimethoxysilane, n-decyltriethoxysilane, n-decyltriisopropoxysilane, n-decyltri-tert-butoxysilane, n-octadecyltrichlorosilane, n-octadecyltribromosilane, n-octadecyltrimethoxysilane, n-octadecyltriethoxysilane, n-octadecyltriisopropoxysilane, n-octadecyltri-tert-butoxysilane, phenyltrichlorosilane, phenyltribromosilane, phenyltrimethoxysilane, phenyltriethoxysilane, phenyltriisopropoxysilane, phenyltri-tert-butoxysilane, tetrachlorosilane, tetrabromosilane, tetramethoxysilane, tetraethoxysilane, tetraisopropoxysilane, tetrabutoxysilane, dimethoxydiethoxysilane, dimethyldichlorosilane, dimethyldibromosilane, dimethyldimethoxysilane, dimethyldiethoxysilane, diphenyldichlorosilane, diphenyldibromosilane, diphenyldimethoxysilane, diphenyldiethoxysilane, phenylmethyldichlorosilane, phenylmethyldibromosilane, phenylmethyldimethoxysilane, phenylmethyldiethoxysilane, triethoxyhydrosilane, tribromohydrosilane, trimethoxyhydrosilane, isopropoxyhydrosilane, tri-tert-butoxyhydrosilane, vinyltrichlorosilane, vinyltribromosilane, vinyltrimethoxysilane, vinyltriethoxysilane, vinyltriisopropoxysilane, vinyltri-tert-butoxysilane, trifluoropropyltrichlorosilane, trifluoropropyltribromosilane, trifluoropropyltrimethoxysilane, trifluoropropyltriethoxysilane, trifluoropropyltriisopropoxysilane, trifluoropropyltri-tert-butoxysilane, γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyltri-tert-butoxysilane, γ-methacryloxypropylmethyldimethoxysilane, γ-methacryloxypropylmethyldiethoxysilane, γ-methacryloxypropylmethoxysilane, γ-methacryloxypropyltriisopropoxysilane, γ-methacryloxypropyltri-tert-butoxysilane, γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyltri-tert-butoxysilane γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyltri-tert-butoxysilane, β-(3,4-epoxycyclohexyl)ethyltrimethoxysilane, β-(3,4-epoxycyclohexyl)ethyltriethoxysilane, $Ti(OR)_4$ (wherein R represents an alkyl group (e.g., methyl, ethyl, propyl, butyl, pentyl, hexyl)), $TiCl_4$, $Zn(OR)_2$, $Zn(CH_3COCHCOCH_3)_2$, Sn $(OR)_4$, $Sn(CH_3COCHCOCH_3)_4$, $Sn(OCOR)_4$, $SnCl_4$, $Zr(OR)_4$, $Zr(CH_3COCHCOCH_3)_4$, $Al(OR)_3$ and $Al(CH_3COCHCOCH_3)_3$.

The hydrophilic organic polymer which forms a composite material with the (semi)metal-containing polymer is described below.

The hydrophilic organic polymer (A) for use in the present invention contains a group (hereinafter sometimes referred to as a specific bond group) capable of forming a hydrogen bond with the (semi)metal-containing polymer. This specific bond group is preferably at least one bond selected from an amido bond (including carboxylic acid amide bond and a sulfonamide bond), a urethane bond and a ureido bond, or a hydroxyl group.

Useful examples of the hydrophilic organic polymer (A) include those containing at least one specific bond group as a repeating unit component on the main chain and/or side chain of the polymer. The repeating unit component is preferably a component where at least one bond selected from —N($R^0$)CO—, —N($R^0$)$SO_2$—, —NHCONH— and —NHCOO— is present on the main chain and/or side chain of the polymer, and/or a component containing —OH group.

Examples of the polymer containing a specific bond group of the present invention on the polymer main chain include an amido resin having —N($R^0$)CO— bond or —N($R^0$)$SO_2$— bond, a ureido group having —NHCONH— bond, and a urethane resin containing —NHCOO— bond.

In the above-described amide bond and sulfonamide bond, $R^0$ represents a hydrogen atom or an organic residue and examples of the organic residue include those described above for the hydrocarbon group and heterocyclic group of $R^{20}$ in formula (II).

With respect to diamines and dicarboxylic acids or disulfonic acids for use in the production of amide resin, diisocyanates for use in the production of ureido resin, and diols for use in the production of urethane resin, compounds described, for example, in *Kobunshi Data Handbook—Kiso Hen—* (*Polymer Data Handbook—Basic Course—*), Chap. I, edited by Kobunshi Gakkai, Bafukan (1986), and Shinzo Yamashita and Tosuke Kaneko (compilers), *Kakyozai Handbook* (*Handbook of Crosslinking Agents*), Taisei Sha (1981) can be used.

Other examples of the polymer having an amide bond include a polymer containing a repeating unit represented by the following formula (III), an N-acylated form of polyalkyleneimine, and polyvinylpyrrolidone and a derivative thereof.

Formula (III)

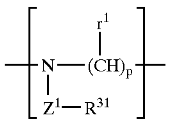

wherein $Z^1$ represents —CO—, —$SO_2$— or —CS—, $R^{31}$ has the same meaning as $R^{11}$ in formula (I), $r^1$ represents a hydrogen atom or an alkyl group having from 1 to 6 carbon atoms (such as methyl group, ethyl group, propyl group, butyl group, pentyl group and hexyl group), $r^1$ may be the same or different, and p represents an integer of 2 or 3.

Out of polymers containing a repeating unit represented by formula (III), the polymer where $Z^1$ represents —CO— and p represents 2 can be obtained by ring-opening polymerizing oxazoline which may have a substituent, in the presence of a catalyst. Examples of the catalyst which can be used include sulfuric acid esters and sulfonic acid esters such as dimethyl sulfate and alkyl p-toluenesulfonate; alkyl halides such as alkyl iodide (e.g., methyl iodide); metal fluorides out of Friedel-Crafts catalysts; acids such as sulfuric acid, hydrogen iodide and p-toluenesulfonic acid, and oxazolinium salts as a salt of this acid with oxazoline. The polymer may be a homopolymer or a copolymer. A copolymer resulting from grafting of this polymer to another polymer may also be used.

Specific examples of the oxazoline include 2-oxazoline, 2-methyl-2-oxazoline, 2-ethyl-2-oxazoline, 2-propyl-2-oxazoline, 2-isopropyl-2-oxazoline, 2-butyl-2-oxazoline, 2-dichloromethyl-2-oxazoline, 2-trichloromethyl-2-oxazoline, 2-pentafluoroethyl-2-oxazoline, 2-phenyl-2-oxazoline, 2-methoxycarbonylethyl-2-oxazoline, 2-(4-methylphenyl)-2-oxazoline and 2-(4-chlorophenyl)-2-oxazoline. Among these oxazolines, preferred are 2-oxazoline, 2-methyl-2-oxazoline and 2-ethyl-2-oxazoline. These oxazoline polymers may be used individually or in combination of two or more thereof.

Other polymers having a repeating unit represented by formula (III) can be similarly obtained using thiazoline, 4,5-dihydro-1,3-oxazine or 4,5-dihydro-1,3-thiazine in place of oxazoline.

Examples of the N-acylated form of polyalkyleneimine include a carboxylic acid amide form containing —N(CO—$R^{31}$)— obtained by a polymer reaction with a carboxylic acid halide, and a sulfonamide form containing —N($So_2$—$R^{31}$)— obtained by a polymer reaction with a sulfonyl halide (wherein $R^{31}$ has the same meaning as $R^{31}$ in formula (III)).

Examples of the polymer containing the specific bond group of the present invention on the polymer side chain include those mainly comprising a component having at least one specific bond group. Examples of this component include acrylamide, methacrylamide, crotonamide, vinylacetic acid amide and the following compounds, however, the present invention is not limited thereto.

In the structural formulae shown below, the symbols denote the followings:

$a^1$: —H or —$CH_3$ $T^0$: —H, —$CH_3$, —$(CH_2)_2OCH_3$ or —$(CH_2)_2N(CH_3)_2$ $L^0$: —$C_xH_{2x+1}$, —$(CH_2)_2OCH_3$, —$(CH_2)_2N(CH_3)_2$, benzyl or —$(CH_2)_xOH$ $L^1$: —H, $L^0$ or —$(CH_2)_2CONH_2$ x: an integer of 1 to 4 y: 0 or 1 z: 0, 1 or 2.

(1)

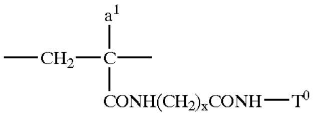

(2)

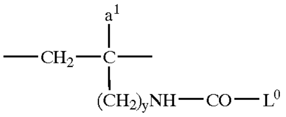

(3)

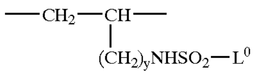

(4)

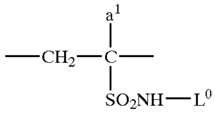

(5)

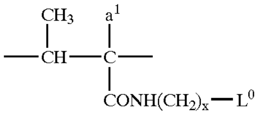

(6)

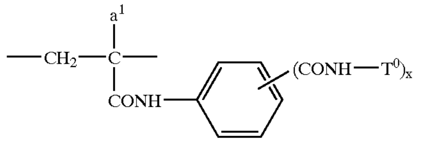

(7)

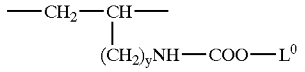

(8)

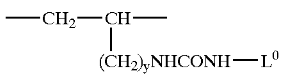

(9)

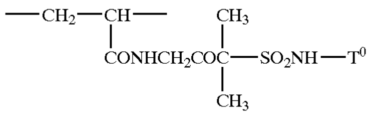

(10)

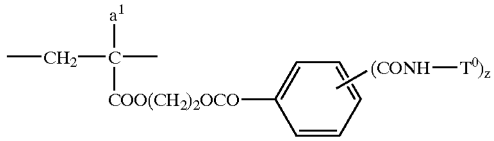

-continued (11)

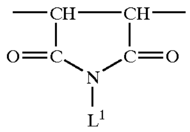

(12)

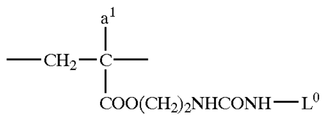

(13)

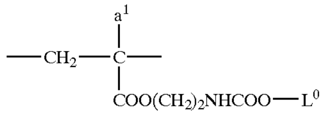

(14)

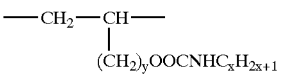

(15)

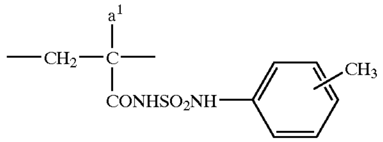

(16)

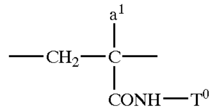

The hydrophilic organic polymer containing a hydroxy group may be a natural water-soluble polymer, a semisynthetic water-soluble polymer or a synthetic polymer and specific examples thereof include those described in Munio Otake (supervisor), *Dai Yuki Kagaku* 19, *Tennen Kobunshi Kagobutsu I* (*Grand Organic Chemistry* 19, *Natural Polymer Compound I*), Asakura Shoten (1960), *Suiyosel Kobunshi•Mizu Bunsann Kata Jushi Sogogijutsu Shiryo Shu* (*Collection of General Technical Data of Water-Soluble Polymers•Aqueous Dispersion-Type Resins*), edited and issued by Keiei Kaihatsu Center Shuppan Bu (1981), Shinji Nagatomo, *Shin•Suiyosei Polymer no Oyo to Shijo* (*New Edition, Application and Market of Water-Soluble Polymers*), CMC (1988), and *Kinosei Cellulose no Kaihatsu* (*Development of Functional Cellulose*), CMC (1985).

Examples of the natural and semisynthetic polymers include cellulose, cellulose derivatives (e.g., cellulose esters; cellulose ethers such as cellulose nitrate, cellulose sulfate, cellulose acetate, cellulose propionate, cellulose succinate, cellulose butyrate, cellulose acetate succinate, cellulose acetate butyrate and cellulose acetate phthalate; methyl cellulose, ethyl cellulose, cyanoethyl cellulose, carboxymethyl cellulose, hydroxyethyl cellulose, hydroxypropyl cellulose, ethyl hydroxyethyl cellulose, hydroxypropylmethyl cellulose, carboxymethyl hydroxyethyl cellulose), starch, starch derivatives (e.g., oxidized starch; esterified starches such as esterified form with nitric acid, sulfuric acid, phosphoric acid, acetic acid, propionic acid, butyric acid and succinic acid; etherified starches such as methylated starch, ethylated starch, cyanoethylated starch, hydroxyalkylated starch and carboxymethylated starch), alginic acid, pectin, carrageenan, tamarind gum, natural rubbers (e.g., gum arabi, guar gum, locust bean gum, tragacanth gum, xanthane gum), pullulan, dextran, casein, gelatin, chitin and chitosan.

Examples of the synthetic polymer include polyvinyl alcohol, polyalkylene glycols (e.g., polyethylene glycol, polypropylene glycol, (ethylene glycol/propylene glycol) copolymer), allyl alcohol copolymers, polymers or copolymers of acrylic acid ester or methacrylic acid ester containing at least one hydroxy group (examples of the ester substituent include a 2-hydroxyethyl group, a 3-hydroxypropyl group, a 2,3-dihydroxypropyl group, a 3-hydroxy-2-hydroxymethyl-2-methylpropyl group, a 3-hydroxy-2,2-di(hydroxymethyl)propyl group, a polyoxyethylene group and a polyoxypropylene group), polymers or copolymers of an N-substituted acrylamide or methacrylamide containing at least one hydroxy group (examples of the N-substituent include a monomethylol group, a 2-hydroxyethyl group, a 3-hydroxypropyl group, a 1,1-bis(hydroxymethyl)ethyl group and a 2,3,4,5,6-pentahydroxypentyl group). However, the synthetic polymer is not particularly limited as long as it contains at least one hydroxy group in the side chain substituent of the repeating unit.

The mass average molecular weight of the hydrophilic organic polymer (A) having a specific bond group is preferably from $10^3$ to $10^6$, more preferably from $10^3$ to $4\times10^5$.

The hydrophilic organic polymer (B) having a silane coupling group at the terminal represented by formula (I) of the present invention is described below. This organic polymer (B) is a polymer described in detail in Japanese Patent Application No. 2001-175952 including the synthesis method.

In formula (I), $R^{01}$, $R^{02}$, $R^{03}$ and $R^{04}$ each independently represents a hydrogen atom or a hydrocarbon group having 8 or less carbon atoms. Examples of the hydrocarbon group include an alkyl group and an aryl group. Among these, a linear, branched or cyclic alkyl group having 8 or less carbon atoms is preferred. Specific examples thereof include a methyl group, an ethyl group, a propyl group, a butyl group, a pentyl group, a hexyl group, a heptyl group, an octyl group, an isopropyl group, an isobutyl group, an s-butyl group, a tert-butyl group, an isopentyl group, a neopentyl group, a 1-methylbutyl group, an isohexyl group, a 2-ethylhexyl group, a 2-methylhexyl group and a cyclopentyl group. In view of effect and easy availability, $R^{01}$, $R^{02}$, $R^{03}$ and $R^{04}$ each is preferably a hydrogen atom, a methyl group or an ethyl group.

The hydrocarbon group may further have a substituent. When the alkyl group has a substituent, the substituted alkyl group is constituted by the bonding of a substituent and an alkylene group and for the substituent, a monovalent nonmetallic atom group excluding hydrogen is used. Preferred examples of the substituent include a halogen atom (e.g., —F, —Br, —Cl, —I), a hydroxy group, an alkoxy group, an aryloxy group, a mercapto group, an alkylthio group, an arylthio group, an alkyldithio group, an aryldithio group, an amino group, an N-alkylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-axylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, a formyl group, an acyl group, a carboxy group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof (hereinafter referred to as a sulfonato group), an alkoxysulfonyl group, an aryloxysulfonyl group, a sulfinamoyl group, an N-alkylsulfinamoyl group, a N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugate base group thereof (hereinafter referred to as a phosphonato group), a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3H$(alkyl)) and a conjugate base group thereof (hereinafter referred to as an alkyl-phosphonato group), a monoarylphosphono group (—$PO_3H$(aryl)) and a conjugate base group thereof (hereinafter referred to as an arylphosphonato group), a phosphonooxy group (—$OPO_3H_2$) and a conjugate base group thereof (hereinafter referred to as a phosphonatooxy group), a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3H$(alkyl)) and a conjugate base group thereof (hereinafter referred to as an alkylphosphonatooxy group), a monoarylphosphonooxy group (—$OPO_3H$(aryl)) and a conjugate base group thereof (hereinafter referred to as an arylphosphonatooxy group), a morpholino group, a cyano group, a nitro group, an aryl group, an alkenyl group and an alkynyl group.

Specific examples of the alkyl group in these substituents include the above-described alkyl groups and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group. Examples of the alkenyl group include a vinyl group, a 1-propenyl group, a 1-butenyl group, a cinnamyl group and a 2-chloro-1-ethenyl group, and examples of the alkynyl group include an ethynyl group, a 1-propynyl group, a 1-butynyl group and a trimethylsilylethynyl group. Examples of $K^1$ in the acyl group ($K^1$CO—) include a hydrogen atom and the above-described alkyl and aryl groups.

Among these substituents, more preferred are a halogen atom (e.g., —F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxy group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diaxylphosphono group, a monoalkylphosphono group, an alkylphosphonato group, a monoarylphosphono group, an arylphosphonato group, a phosphonooxy group, a phosphonatooxy group, an aryl group and an alkenyl group.

Examples of the alkylene group in the substituted alkyl group include a divalent organic residue resulting from the elimination of any one hydrogen atom on the above-described alkyl group having from 1 to 20 carbon atoms and preferred are a linear alkylene group having from 1 to 12 carbon atoms, a branched alkylene group having from 3 to 12 carbon atoms and a cyclic alkylene group having from 5 to 10 carbon atoms. Specific preferred examples of the substituted alkyl group obtained by combining the substituent and the alkylene group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxyethyl group, a 2-oxypropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzly group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl and a 3-butynyl group.

L represents a single bond or an organic linking group. When L represents an organic linking group, L is a polyvalent linking group composed of nonmetallic atoms, more specifically, from 1 to 60 carbon atoms, from 0 to 10 carbon atoms, from 0 to 50 oxygen atoms, from 1 to 100 hydrogen atoms and from 0 to 20 sulfur atoms. More specific examples of the linking group include the following structural units and a linking group composed of a combination of these structural units.

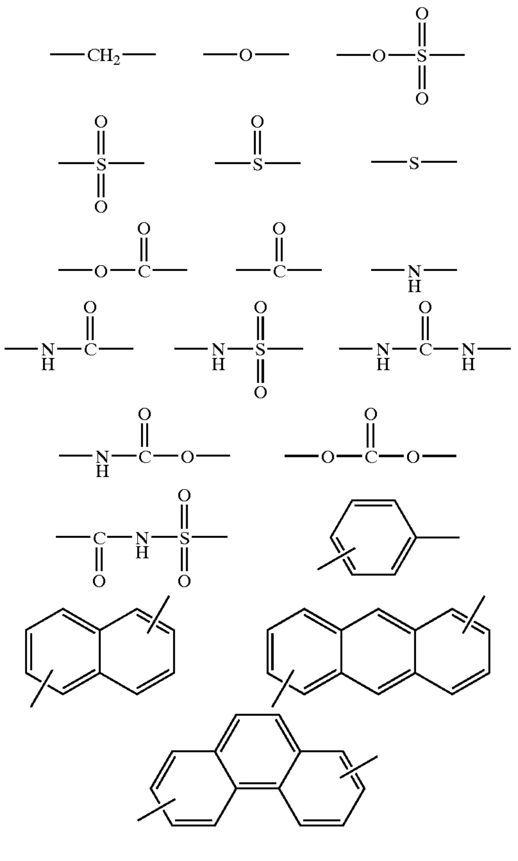

W represents $—NHCOR^{05}$, $—CONH_2$, $—CON(R^{05})_2$, $—COR^{05}$, —OH, $—CO_2M$ or $—SO_3M$, wherein $R^{05}$ represents a linear, branched or cyclic alkyl group having from 1 to 8 carbon atoms. In the case where a plurality of $R^{05}$ are present as in $—CON(R^{05})_2$, $R^{05}$ may be the same or different or $R^{05}$ may combine with each other to form a ring. The formed ring may be a heterocyclic ring containing a heteroatom such as oxygen atom, sulfur atom and nitrogen atom. $R^{05}$ may further have a substituent and examples of the substituent which can be introduced here include those described above for the substituent which can be introduced when $R^{01}$, $R^{02}$, $R^{03}$ and $R^{04}$ each is an alkyl group.

To speak specifically, $R^{05}$ is preferably a methyl group, an ethyl group, a propyl group, a butyl group, a pentyl group, a hexyl group, a heptyl group, an octyl group, an isopropyl group, an isobutyl group, an s-butyl group, a tert-butyl group, an isopentyl group, a neopentyl group, a 1-methylbutyl group, an isohexyl group, a 2-ethylhexyl group, a 2-methylhexyl group or a cyclopentyl group.

W is preferably $—NHCOCH_3$, $—CONH_2$, —COOH, $—SO_3^-Nme_4^+$ or a morpholino group.

M represents a hydrogen atom, an alkali metal such as lithium, sodium and potassium, an alkaline earth metal such as calcium and barium, or an onium such as ammonium, iodonium or sulfonium.

The molecular weight of the hydrophilic organic polymer (B) represented by formula (I) is, in terms of the mass average molecular weight (Mw), preferably from 200 to 100,000, more preferably from 300 to 50,000, still more preferably from 500 to 20,000.

Specific examples of the hydrophilic organic polymer (B) suitable for the present invention are set forth below, however, the present invention is not limited thereto.

(Mw)

B-1

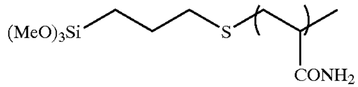

5000

B-2

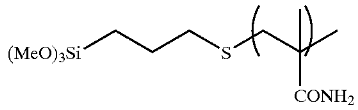

10000

B-3

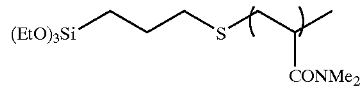

5000

B-4

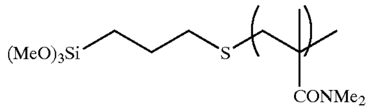

8000

B-5

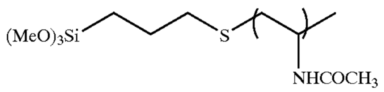

5000

B-6

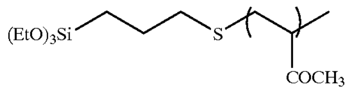

7000

B-7

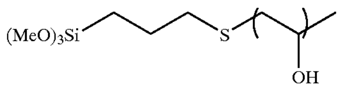

4000

B-8

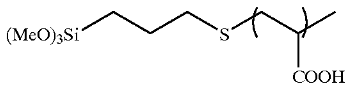

6000

B-9

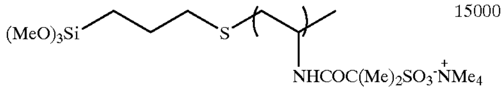

15000

B-10

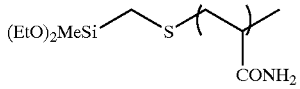

5000

B-11

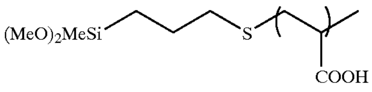

6000

B-12

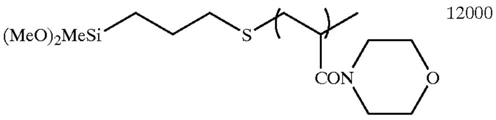

12000

The organic polymer (B) for use in the present invention can be synthesized by performing a radical polymerization using a radical polymerizable monomer represented by the following formula (i) and a silane coupling agent having a chain transferring ability at the radical polymerization represented by the following formula (ii). Since the silane coupling agent (ii) has a chain transferring ability, a polymer where a silane coupling group is introduced into the terminal of the polymer main chain at the radical polymerization can be synthesized.

(i)

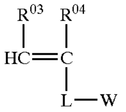

(ii)

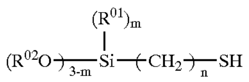

wherein $R^{01}$ to $R^{04}$, L, W, n and m have the same meanings as defined above in formula (I). These compounds are commercially available or can be easily synthesized.

As the radical polymerization method for synthesizing the organic polymer (B) represented by formula (II), any conventionally known method may be used. The radical polymerization method in general is specifically described, for example, in *Shin Kobunshi Jikken Gaku* 3, *Kobunshi no Gosei to Hanno* 1 (*New Polymer Experimental Study* 3, *Synthesis and Reaction of Polymers* 1), edited by Kobunshi Gakkai, Kyoritsu Shuppan, *Shin Jikken Kagaku Koza* 19, *Kobunshi Kagaku* (*I*) (*New Experimental Chemistry Course, Polymer Chemistry* (*I*)), edited by Nippon Ragaku Kai, Maruzen, *Busshitsu Kogaku Koza, Kobunshi Gosei Kagaku* (*Material Engineering Course, Polymer Synthesis Chemistry*), Tokyo Denki Daigaku Shuppan Kyoku, and these can be applied.

In forming a composite material of a (semi)metal-containing polymer and an organic polymer, a sole organic polymer may be used or two or more organic polymers may be used. The ratio between the (semi)metal-containing polymer and the organic polymer can be selected over a wide range but is preferably, in terms of the mass ratio of (semi)metal-containing polymer/organic polymer, from 10/90 to 90/10, more preferably from 20/80 to 80/20. With this range, the film strength of the hydrophilic layer and the water resistance against fountain solution at the printing can be in a satisfactorily high level.

In the binder polymer containing the composite material of the present invention, a uniform organic and inorganic hybrid is formed by the hydrogen bonding action or the like between the hydroxy group in the (semi)metal-containing polymer produced by the hydrolytic polycondensation of the (semi)metal compound and the specific bond group in the hydrophilic organic polymer and a microscopically homogeneous state is provided without causing phase separation. In the case where a hydrocarbon group is present in the (semi)metal-containing polymer, this polymer seems to more increase in the affinity for the hydrophilic organic polymer due to the hydrocarbon group. The composite material of the present invention has excellent film-forming property.

The composite material of the present invention is produced by hydrolytically polycondensing the (semi)metal compound and mixing it with the hydrophilic organic polymer, or by hydrolytically polycondensing the (semi) metal compound in the presence of the hydrophilic organic polymer. The organic•inorganic polymer composite material of the present invention is preferably obtained by hydrolytically polycondensing the (semi)metal compound in the presence of the hydrophilic organic polymer according to a known sol-gel method. In the organic•inorganic polymer composite material produced, the hydrophilic organic polymer is uniformly dispersed in a gel matrix (namely, a three-dimensional fine network structure of inorganic (semi) metal oxide) produced by the hydrolytic polycondensation of the (semi)metal compound.

In order to accelerate the hydrolysis and co-condensation reaction of the (semi)metal compound represented by formula (II), an acidic catalyst or a basic catalyst is preferably used in combination.

As the catalyst, an acid or a basic compound is used as it is or after dissolving it in water or a solvent such as alcohol (hereinafter referred to as an acidic catalyst or a basic catalyst, respectively). The concentration at this time is not particularly limited but when the concentration is high, hydrolysis and polycondensation are liable to proceed at a high speed. However, if a basic catalyst in a high concentration is used, precipitate may be produced in the sol solution. Therefore, the concentration of the basic catalyst is preferably 1 N (in terms of the concentration in an aqueous solution) or less.

The kind of the acidic or basic catalyst is not particularly limited, however, in the case where a catalyst in a high concentration must be used, the catalyst is preferably composed of elements which scarcely remain in the catalyst crystal grain after sintering. Specific examples of the acidic catalyst include hydrogen halides such as hydrochloric acid, carboxylic acids such as nitric acid, sulfuric acid, sulfurous acid, hydrogen sulfide, perchloric acid, hydrogen peroxide, carbonic acid, formic acid and acetic acid, substituted carboxylic acids where R in the structural formula RCOOH is substituted by other element or substituent, and sulfonic acids such as benzenesulfonic acid. Examples of the basic catalyst include ammonical bases such as aqueous ammonia, and amines such as ethylamine and aniline.

The hydrophilic layer of the present invention can contain a colloid of an oxide or hydroxide of at least one element selected from beryllium, magnesium, aluminum, silicon, titanium boron, germanium, tin, zirconium, iron, vanadium, antimony and transition metals. Among oxides and hydroxides of these elements, preferred is an oxide or hydroxide of an element selected from aluminum, silicon, titanium and zirconium.

The particle size of the colloid is preferably from 5 to 100 nm, more preferably from 5 to 50 nm. The dispersion solution of such a colloid is also commercially available, for example, from Nissan Chemicals Industries, Ltd.

The colloid can also be added to the hydrophilic layer as a component of a solution for the preparation of a hydrophilic binder by allowing it to coexist at the time of producing the composite material of a (semi)metal-containing polymer and a hydrophilic organic polymer.

In the hydrophilic layer, a crosslinking agent may be added so as to more increase the film strength. The crosslinking agent includes compounds which are usually used as the crosslinking agent. More specifically, compounds described, for example, in Shinzo Yamashita and Tosuke Kaneko (compilers), *Kakyozai Handbook* (*Handbook of Crosslinking Agents*), Taisei Sha (1981), and *Kobunshi Data Handbook—Kiso Hen—* (*Polymer Data Handbook—Basic Course—*), edited by Kobunshi Gakkai, Bafukan (1986) can be used.

Examples of the crosslinking agent include ammonium chloride, metal ions, organic peroxides, polyisocyanate-base compounds (e.g., toluylene diisocyanate, diphenylmethane diisocyanate, triphenylmethane triisocyanate, polymethylene phenylisocyanate, hexamethylene diisocyanate, isophorone diisocyanate, polymer polyisocyanate), polyol-base compounds (e.g., 1,4-butanediol, polyoxypropylene glycol, polyoxyethylene glycol, 1,1,1-trimethylolpropane.), polyamine-base compounds (e.g., ethylenediamine, γ-hydroxypropylated ethylenediamine, phenylenediamine, hexamethylenediamine, N-aminoethylpiperazine, modified aliphatic polyamines), polyepoxy group-containing compounds and epoxy resins (e.g., compounds described in Hiroshi Kakiuchi (compiler), *Shin Epoxy Jushi* (*New Epoxy Resins*), Shokodo (1985), and Kuniyuki Hashimoto (compiler), *Epoxy Jushi* (*Epoxy Resins*), Nikkan Kogyo Shinbunsha (1969)), melamine resins (e.g., compounds described in Ichiro Miwa and Hideo Matsunaga, *Urea•Melamine Jushi* (*Urea•Melamine Resins*), Nikkan Kogyo Shinbunsha (1969)), and poly(meth)acrylate compounds (e.g., compounds described in Makoto Ogawara, Takeo Saegusa and Toshinobu Higashimura, *Oligomer*, Kodansha (1976), and Eizo Omori, *Kinousei Acryl Kei Jushi* (*Functional Acrylic Resins*), Techno System (1985)).

In the hydrophilic layer of the present invention, a light-heat converting substance can be added so as to convert light energy into heat energy with good efficiency. The light-heat converting substance which can be used in the present invention is not particularly limited and any substance can be used as long as it can absorb light such as ultraviolet light, visible light and infrared light and convert the light into heat. The light-heat converting substance is preferably a dye, pigment or metal which effectively absorbs infrared light at a wavelength of 760 to 1,200 nm.

Preferred examples of the dye include cyanine dyes described in JP-A-58-125246, JP-A-59-84356, JP-A-60-78787, JP-A-10-268512 and U.S. Pat. No. 4,973,572, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, cyanine dyes described in British Patent 434,875, near infrared absorbing sensitizers described in U.S. Pat. No. 5,156,938, substituted arylbenzo(thio)pyrylium salts described in U.S. Pat. No. 3,881,924, trimethinethiapyrylium salts described in JP-A-57-142645 (U.S. Pat. No. 4,327,169), pyrylium-base compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, pyrylium compounds described in JP-B-5-13514 (the term "JP-B" as used herein means an "examined Japanese patent publication") and JP-B-5-19702, and near infrared absorbing dyes represented by formulae (I) and (II) of U.S. Pat. No. 4,756,993. Among these, preferred are cyanine dyes, squarylium dyes, pyrylium salts and nickel thiolate complexes.

As the pigment, commercially available pigments and pigments described in *Color Index* (*C.I.*) *Binran* (*C.I. Handbook*), *Saishin Ganryo Binran* (*Newest Pigment Handbook*), edited by Nippon Ganryo Gijutsu Kyokai (1977), *Saishin Ganryo Oyo Gijutsu* (*Newest Pigment Application Technology*), CMC (1986), and *Insatsu Ink Gijutsu* (*Printing Ink Technology*), CMC (1984) may be used. Specific examples of the pigment which can be used include insoluble azo pigments, azo lake pigments, condensed azo pigments, chelate azo pigments, phthalocyanine-base pigments, anthraquinone-base pigments, perylene- and perynone-base pigments, thioindigo-base pigments, quinacridone-base pigments, dioxazine-base pigments, isoindolinone-base pigments, quinophthalone-base pigments, dyed lake pigments, azine pigments, nitroso pigments, nitro pigments, natural pigments, fluorescent pigments, inorganic pigments and carbon black. The pigment may not be surface-treated before use or may be subjected to a known surface treatment and then used. Among these pigments, carbon black is preferred.

As the metal fine particle, metal fine particles described in JP-A-2001-20592 are preferred. More specifically, Ag, Au, Cu, Sb, Ge and Pb are preferred, and Ag, Au and Cu are more preferred.

The light-heat converting substance may be incorporated into a matrix formed by the hydrophilic binder polymer or into the hydrophobicizing precursor, namely, a hydrophobic substance in the polymer fine particle of single structure, in the core of the core-shell type fine particle or in the microcapsule. In the former case, a water-soluble or hydrophilic light-heat converting substance is preferred and in the latter case, a lipophilic light-heat converting substance is preferred.

This dye or pigment can be used in a ratio of, based on the solid content of the hydrophilic layer, from 0.01 to 50 weight %, preferably from 0.1 to 10 weight % and in the case of dye, still more preferably from 0.5 to 10 weight % or in the case of pigment, still more preferably from 3.1 to 10 weight %. The amount of the metal fine particle added is preferably 10 weight % or more of the entire solid content in the hydrophilic layer.

In the hydrophilic layer of the present invention, a nonionic surfactant, an anionic surfactant, a cationic or fluorine-containing surfactant described in JP-A-2-195356, or an amphoteric surfactant described in JP-A-59-121044 and JP-A-4-13149 can be added so as to improve the dispersion stability of the hydrophilic layer, the coating performance, the on-press developability, the printing performance or the like. The amount added is preferably from 0.05 to 5 weight % of the solid content in the hydrophilic layer.

The sol-gel method may be performed according to a conventionally known sol-gel method. More specifically, this can be performed according to a method described in detail, for example, in *Sol-Gel Ho ni yoru Usumaku Coating Gijutsu* (*Thin Film Coating Technology by Sol-Gel Method*), Gijutsu Joho Kyokai (1995), Sumio Sakka, *Sol-Gel Ho no Kagaku* (*Science of Sol-Gel Method*), Agne Shofusha (1988), and Seki Hirashima, *Saishin Sol-Gel Ho ni yoru Kinosei Usumaku Sakusei Gijutsu* (*Newest Technology of Functional Thin Film Formation by Sol-Gel Method*), Sogo Gijutsu Center (1992).

The coating solution for the hydrophilic layer is preferably prepared using an aqueous solvent and in order to form a homogenous solution by preventing precipitation during the preparation of the coating solution, a water-soluble solvent is used in combination. Examples of the water-soluble solvent include alcohols (e.g., methanol, ethanol, propyl alcohol, ethylene glycol, diethylene glycol, propylene glycol, dipropylene glycol, ethylene glycol monomethyl ether, propylene glycol monomethyl ether, ethylene glycol monoethyl ether), ethers (e.g., tetrahydrofuran, ethylene glycol dimethyl ether, propylene glycol dimethyl ether, tetrahydrofuran), ketones (e.g., acetone, methyl ethyl ketone, acetylacetone), esters (e.g., methyl acetate, ethylene glycol monoacetate) and amides (e.g., formamide, N-methylformamide, pyrrolidone, N-methylpyrrolidone). These solvents may be used individually or in combination of two or more thereof.

A coating solution for the hydrophilic layer, where necessary components are dissolved or dispersed, is prepared, coated on a water-resistant support using a conventionally known coating method, and dried, whereby the hydrophilic layer of the present invention is formed. The thickness of the hydrophilic layer formed is preferably from 0.2 to 10 $g/m^2$, more preferably from 0.5 to 8 $g/m^2$. Within this range, a uniform and sufficiently strong film can be formed.

In the present invention, a surface graft hydrophilic layer where a polymer compound having a hydrophilic functional group is chemically bonded to the surface of the hydrophilic layer can be provided. By providing such a surface graft hydrophilic layer, the water retentivity of the hydrophilic layer can be enhanced without impairing the adhesion to the image-forming layer.

In the surface graft hydrophilic layer, the terminal of a polymer compound having at least one hydrophilic functional group is chemically bonded to the hydrophilic layer of the lithographic printing plate directly or through another binding polymer compound (hereinafter, this binding polymer compound is sometimes referred to particularly as a "trunk polymer compound").

The polymer compound having a hydrophilic functional group, constituting the graft moiety, is not particularly limited but is preferably a linear polymer compound. Examples of the hydrophilic functional group include an amide group, a carboxy group, a sulfo group, a phosphoric acid, a phosphonic acid, an amino group, a salt thereof, and a 2-trimethylaminoethyl (meth)acrylate or a hydroacid halide salt thereof.

It is sufficient if at least one hydrophilic functional group is contained in the polymer compound constituting the graft moiety. For example, a hydrophilic functional group is present at the terminal opposite the bonding part of the linear polymer compound to the hydrophilic layer, or the linear polymer contains a hydrophilic monomer as a polymerization or copolymerization component.

The hydrophilic monomer which can be used in the present invention is not particularly limited as long as it has the above-described hydrophilic functional group. Examples of particularly useful hydrophilic monomers include a (meth)acrylic acid or an alkali metal salt or amine salt thereof, an itaconic acid or an alkali metal salt or amine salt thereof, a 2-hydroxyethyl (meth)acrylate, a (meth) acrylamide, an N-monomethylol(meth)acrylamide, an N-dimethylol(meth)acrylamide or allylamine or a hydroacid halide salt thereof, a 3-vinylpropionic acid or an alkali metal salt or amine salt thereof, a vinylsulfonic acid or an alkali metal salt or amine salt thereof, a vinylstyrenesulfonic acid or an alkali metal salt or amine salt thereof, a 2-sulfoethylene (meth)acrylate or 3-sulfopropylene (meth) acrylate or an alkali metal salt or amine salt thereof, a polyoxyethylene glycol mono(meth)acrylate or 2-acrylamido-2-methylpropanesulfonic acid or an alkali metal salt or amine salt thereof, and an acid phosphoxy polyoxyethylene glycol mono(meth)acrylate or allylamine or a hydroacid halide salt thereof.

The surface graft hydrophilic layer of the present invention can be easily produced by using a method generally called surface graft polymerization. The graft polymerization is a method where an active seed is imparted on a polymer chain and another monomer of which polymerization is started by the active seed is polymerized to synthesize a graft polymer. In particular, when the polymer chain to which the active seed is imparted forms a solid surface, this method is called surface graft polymerization. The surface graft hydrophilic layer of the present invention can be easily obtained by performing the surface graft polymerization on the surface of the hydrophilic layer.

As the surface graft polymerization for obtaining a surface graft hydrophilic layer, any known method described in publications can be used. Examples thereof include surface graft polymerization methods such as photo-graft polymerization and plasma irradiating graft polymerization described in *Shin Kobunshi Jikken Gaku* 3 (*New Polymer Experimental Study* 3), page, 135, edited by Kobunshi Gakkai, Kyoritsu Shuppan (1994), and radiation irradiating graft polymerization methods using γ line or electron beam described in Takeuchi (supervisor), *Kyuchaku Gijutsu Binran* (*Handbook of Adsorption Technology*), pages 203 and 695, NTS (February, 1999). As for the specific method for the photo-graft polymerization, the methods described in JP-A-10-296895 and JP-A-11-119413 can be used.

Other than these methods, the surface graft hydrophilic layer can be formed by a method of imparting a reactive functional group such as trialkoxysilyl group, isocyanate group, amino group, hydroxyl group and carboxy group to the terminal of a polymer compound chain and causing a coupling reaction between this reactive functional group and the functional group on the hydrophilic layer surface of the lithographic printing plate.

In the case of producing a surface graft hydrophilic layer comprising a trunk polymer compound chemically bonded to the hydrophilic layer surface and a linear polymer compound having a hydrophilic functional group bonded at the terminal of the polymer chain to the trunk polymer compound, a functional group capable of causing a coupling reaction with the functional group on the hydrophilic layer surface is imparted to the side chain of the trunk polymer compound, a graft-type polymer compound having integrated therein a polymer compound having a hydrophilic functional group as the graft chain is synthesized, and the intended layer can be formed by a coupling reaction between this polymer and the functional group on the hydrophilic layer surface. Specific examples of this trunk polymer compound include those described above as the hydrophilic organic polymer (A) or (B) which forms a composite material with the (semi)metal-containing polymer.

Among those photo-graft polymerization method, plasma irradiating graft polymerization method, radiation irradiating graft polymerization method and coupling method, in view of suitability for production, the plasma irradiating graft polymerization and the radiation irradiating graft polymerization are particularly excellent.

Specific examples of the plasma irradiating graft polymerization and the radiation irradiating graft polymerization include the methods described in the above-described publications and Y. Ikeda et al., *Macromolecules*, Vol. 19, page 1804 (1986). The hydrophilic layer surface is treated with plasma or electron beam to generate a radical on the surface and thereafter, this active surface is reacted with a monomer having a hydrophilic functional group, whereby the surface graft hydrophilic layer can be obtained.

The thickness of the surface graft hydrophilic layer of the present invention is preferably from 0.01 to 10 $g/m^2$, more preferably from 0.1 to 5 $g/m^2$. Within this range, the effect of the present invention can be satisfactorily exerted and a long press life and good reproducibility of fine line of a printed matter can be advantageously attained.

In the present invention, the smoothness on the surface of the hydrophilic layer formed on a water-resistant support (when a surface graft hydrophilic layer is formed, the smoothness on the surface of the graft hydrophilic layer) is preferably, in terms of Bekk smoothness, 5000 (sec/10 ml) or less, more preferably 1,000 or less, still more preferably 500 or less. The "Bekk smoothness" can be measured by a Bekk smoothness tester. More specifically, a sample piece is pressed on a circular glass plate finished to a high smoothness and having a hole at the center while applying a constant pressure (1 kg/$cm^2$) and the time (second) necessary for a constant amount (10 ml) of air to pass between the glass face and the sample piece under reduced pressure is measured. The Bekk smoothness is expressed by this time and used as an index for the surface smoothness.

Image-forming Layer

The image-forming layer of the present invention contains a microcapsule encapsulating (enclosing) a hydrophobic substance. The hydrophobic substance in the image-forming layer is preferably a low molecular compound having a molecular weight of less than 10,000, more preferably less than 7,000, still more preferably less than 5,000.

Also, this hydrophobic substance is preferably a compound having a heat reactive group. The microcapsule may be constructed such that microcapsules can react with each other through the heat reactive group, or in the case of containing a hydrophilic polymer compound or a low molecular compound as another additive in the image-forming layer, such that the heat reactive group can react with the hydrophilic polymer compound or low molecular compound. Furthermore, a construction such that two or more kinds of microcapsules have respective heat reactive groups of causing a heat reaction therebetween and microcapsules can react with each other may be employed. The microcapsule of the present invention may have a structure where a compound having a heat reactive group is enclosed in the microcapsule, where the compound is contained in the outer wall of the microcapsule or where the compound is enclosed in the microcapsule and at the same time, contained in the outer wall of the microcapsule.

The microcapsule is preferably a microcapsule where the hydrophobic substance contained is a compound having a heat reactive group, and may be constructed such that microcapsules can react with each other through the heat reactive group, or in the case of containing a binder polymer described later or a low molecular compound as another additive in the image-forming layer, such that the heat reactive group can react with the binder polymer or low molecular compound. Furthermore, a construction such that two or more kinds of microcapsules have respective heat reactive groups of causing a heat reaction therebetween and microcapsules can react with each other may be employed. Examples of the reaction by this heat reactive group include a polymerization reaction by an unsaturated group, an addition reaction by an isocyanate group or a block form thereof and a compound having an active hydrogen atom (e.g., amine, alcohol, carboxylic acid), an addition reaction of an epoxy group and an amino group, carboxy group or hydroxy group, a condensation reaction of a carboxy group and a hydroxy group or an amino group, and a ring-opening addition reaction of an acid anhydride and an amino group or a hydroxy group. The heat reactive group may perform any reaction as long as a chemical bond is formed.

Examples of the heat reactive group include an ethylenically unsaturated group of performing a polymerization reaction (such as acryloyl group, methacryloyl group, vinyl group and allyl group), an isocyanate group of performing an addition reaction or a block form thereof and a functional group having an active hydrogen atom as the other party of the reaction (such as amino group, hydroxyl group and carboxyl group), an epoxy group of performing an addition reaction and an amino, carboxyl or hydroxyl group as the other party of the reaction, a carboxyl group of performing a condensation reaction and a hydroxyl or amino group, an acid anhydride of performing a ring-opening addition reaction and an amino or hydroxyl group, and a diazonium group of thermally decomposing and reacting with a hydroxy group or the like. However, as long as a chemical bond is formed, the functional group may perform any reaction.

The microcapsule enclosing a compound having a heat reactive group can be obtained by a method where a compound (this compound is described in detail later) having a heat reactive group such as acrylate group, methacrylate group, vinyl group, allyl group, epoxy group, amino group, hydroxy group, carboxy group, isocyanate, acid anhydride and a group after protection thereof is enclosed in the microcapsule or the compound is introduced into the outer wall of the microcapsule. Also, the compound having a heat reactive group may be enclosed in the microcapsule and at the same time, introduced into the outer wall of the microcapsule.

Examples of the compound having a heat reactive group, which is contained in the microcapsule, include compounds having an unsaturated group. The compound having an unsaturated group is a radical polymerizable compound having at least one ethylenically unsaturated double bond and is selected from compounds having at least one terminal ethylenically unsaturated bond, preferably two or more terminal ethylenically unsaturated bonds. Such compounds are widely known in the field of this art and these can be used in the present invention without any particular limitation. These compounds have a chemical form such as monomer, prepolymer (namely, dimer, trimer or oligomer) or a mixture or copolymer thereof. Examples of the monomer and copolymer thereof include unsaturated carboxylic acids (e.g., acrylic acid, methacrylic acid, itaconic acid, crotonic acid, isocrotonic acid, maleic acid) and esters and amides thereof. Among these, preferred are esters of an unsaturated carboxylic acid and an aliphatic polyhydric alcohol compound, and amides of an unsaturated carboxylic acid and an aliphatic polyvalent amine compound. Also, an addition reaction product of an unsaturated carboxylic acid ester or amide having a nucleophilic substituent such as hydroxy group, amino group and mercapto group with a monofunctional or polyfunctional isocyanate or epoxy, and a dehydration condensation reaction product with a monofunctional or polyfunctional carboxylic acid are suitably used. Furthermore, an addition reaction product of an unsaturated carboxylic acid ester or amide having an electrophilic substituent such as isocyanate group and epoxy group with a monofunctional or polyfunctional alcohol, amine or thiol, and a displacement reaction product of an unsaturated carboxylic acid ester or amide having a releasable substituent such as halogen group and tosyloxy group with a monofunctional or polyfunctional alcohol, amine or thiol are also suitably used. In addition, these compounds where the unsaturated carboxylic acid is replaced by an unsaturated phosphonic acid, styrene or the like may also be used.

Specific examples of the radical polymerizable compound which is an ester of an aliphatic polyhydric alcohol compound and an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane diacrylate, trimethylolpropane tri (acryloyloxypropyl) ether, trimethylolethane triacrylate, trimethylolethane diacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri-(acryloyloxyethyl)isocyanurate and polyester acrylate oligomer;

- methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl] dimethylmethane and bis[p-(methacryloxyethoxy) phenyl]dimethylmethane;
- itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate;
- crotonic acid esters such as ethylene glycol dicrotonate, tetramethylene glycol dicrotonate, pentaerythritol dicrotonate and sorbitol tetradicrotonate;
- isocrotonic acid esters such as ethylene glycol diisocrotonate, pentaerythritol diisocrotonate and sorbitol tetraisocrotonate; and
- maleic acid esters such as ethylene glycol dimaleate, triethylene glycol dimaleate, pentaerythritol dimaleate and sorbitol tetramaleate.

Other examples of the ester include aliphatic alcohol-base esters described in JP-B-46-27926, JP-B-51-47334 and JP-A-57-196231, those having an aromatic skeleton described in JP-A-59-5240, JP-A-59-5241 and JP-A-2-226149, and those having an amino group described in JP-A-1-165613.

Specific examples of the amide monomer of an aliphatic polyvalent amine compound and an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Other preferred examples of the amide-base monomer include those having a cyclohexylene structure described in JP-B-54-21726.

In addition, urethane-base addition polymerizable compounds produced using an addition reaction of isocyanate and a hydroxyl group are suitably used and specific examples thereof include vinyl urethane compounds having two or more polymerizable vinyl groups in one molecule described in JP-B-48-41708, which are obtained by adding a vinyl monomer having a hydroxyl group, such as hydroxyethyl acrylate or methacrylate and hydroxypropyl acrylate or methacrylate, to a polyisocyanate compound having two or more isocyanate groups within one molecule.

Also, urethane acrylates described in JP-A-51-37193, JP-B-2-32293 and JP-B-2-16765, and urethane compounds having an ethylene oxide-base skeleton described in JP-B-58-49860, JP-B-56-17654, JP-B-62-39417 and JP-B-62-39418 are suitably used.

Furthermore, radical polymerizable compounds having an amino structure or a sulfide structure within the molecule described in JP-A-63-277653, JP-A-63-260909 and JP-A-1-105238 may be used.

Other examples include polyfunctional acrylates and methacrylates such as polyester acrylates and epoxy acrylates obtained by reacting epoxy resin and (meth)acrylic acid described in JP-A-48-64183, JP-A-49-43191 and JP-B-52-30490, specific unsaturated compounds described in JP-B-46-43946, JP-B-1-40337 and JP-B-1-40336, and vinylphosphonic acid-base compounds described in JP-A-2-25493. In some cases, a structure having a perfluoroalkyl group described in JP-A-61-22048 is suitably used. Furthermore, those described as a photocurable monomer or oligomer in *Nippon Secchaku Kyokaishi* (*Journal of Japan Adhesive Society*), Vol. 20, No. 7, pp. 300–308 (1984) may be used.

Preferred examples of the epoxy compound include glycerin polyglycidyl ether, polyethylene glycol diglycidyl ether, polypropylene diglycidyl ether, trimethylolpropane polyglycidyl ether, sorbitol polyglycidyl ether, and bisphenols, polyphenols and their polyglycidyl ether form as a hydrogenated product.

Preferred examples of the compound having isocyanate include tolylene diisocyanate, diphenylmethane diisocyanate, polymethylene polyphenyl polyisocyanate, xylylene diisocyanate, naphthalene diisocyanate, cyclohexanephenylene diisocyanate, isophorone diisocyanate, hexamethylene diisocyanate, cyclohexyl diisocyanate, and compounds resulting from blocking these isocyanate compounds with an alcohol or an amine. Preferred examples of the amine compound include ethylenediamine, diethylenetriamine, triethylenetetramine, hexamethylenediamine, propylenediamine and polyethyleneimine.

Preferred examples of the compound having a hydroxy group include compounds having a terminal methylol, polyhydric alcohols such as pentaerythritol, and bisphenol•epolyphenols.

Preferred examples of the compound having a carboxy group include aromatic polyvalent carboxylic acids such as pyromellitic acid, trimellitic acid and phthalic acid, and aliphatic polyvalent carboxylic acids such as adipic acid. Preferred examples of the acid anhydride include pyromellitic anhydride and benzophenonetetracarboxylic anhydride.

Preferred examples of the copolymer having an ethylenically unsaturated group include allyl methacrylate copolymers such as allyl methacrylate/methacrylic acid copolymer, allyl methacrylate/ethyl methacrylate copolymer, and allyl methacrylate/butyl methacrylate.

In particular, (1) a compound having a radical polymerizable group and (2) a compound having an epoxy or vinyloxy group are preferred.

The "compound having a radical polymerizable group" of (1) is a radical polymerizable group having at least one ethylenically unsaturated double bond and is selected from compounds having at least one terminal ethylenically unsaturated bond, preferably two or more terminal ethylenically unsaturated bonds. Such compounds are widely known in the field of this art and these can be used in the present invention without any particular limitation. These compounds have a chemical form such as monomer, prepolymer (namely, dimer, trimer or oligomer), polymer or copolymer, and can be used individually or in combination of two or more thereof.

In the case of using a polymer or a copolymer, an ethylenically unsaturated double bond such as (meth) acryloyl group, vinyl group and allyl group may be introduced at the polymerization or may be introduced using a polymer reaction after the polymerization.

Examples of the monomer and copolymer thereof include unsaturated carboxylic acids (e.g., acrylic acid, methacrylic acid, itaconic acid, crotonic acid, isocrotonic acid, maleic acid) and esters and amides thereof. Among these, preferred are esters of an unsaturated carboxylic acid and an aliphatic polyhydric alcohol compound, and amides of an unsaturated carboxylic acid and an aliphatic polyvalent amine compound. Also, an addition reaction product of an unsaturated carboxylic acid ester or amide having a nucleophilic substituent such as hydroxy group, amino group and mercapto group with a monofunctional or polyfunctional isocyanate or epoxy, and a dehydration condensation reaction product with a monofunctional or polyfunctional carboxylic acid are suitably used. Furthermore, an addition reaction product of an unsaturated carboxylic acid ester or amide having an electrophilic substituent such as isocyanate group and epoxy group with a monofunctional or polyfunctional alcohol, amine or thiol, and a displacement reaction product of an unsaturated carboxylic acid ester or amide having a releasable substituent such as halogen group and tosyloxy group with a monofunctional or polyfunctional alcohol, amine or thiol are also suitably used. In addition, these compounds where the unsaturated carboxylic acid is replaced by an unsaturated phosphonic acid, styrene or the like may also be used.

Specific examples of the radical polymerizable group which is an ester of an aliphatic polyhydric alcohol compound and an unsaturated carboxylic acid include the compounds described in JP-A-2001-293971, paragraphs [0021] to [0024]. Specific examples of other polymerizable compounds such as ester compounds other than those described above, monomers as an amide of an aliphatic polyvalent amine and an unsaturated carboxylic acid, and urethane-base addition polymerizable compound produced using an isocyanate by an addition reaction of the hydroxy group include the compounds described in JP-A-2001-293971, paragraphs [0025] to [0031].

The "compound having an epoxy or vinyloxy group" in (2) is preferably a compound having two or more functional groups within the molecule. When two or more functional groups are present in the molecule, crosslinking can be effectively attained, and high sensitivity and long press life as a lithographic printing plate precursor can be realized.

Examples of the compound having an epoxy group include glycidyl ether compounds or a prepolymer thereof obtained by a reaction of a polyhydric alcohol or phenol and an epichlorohydrin, and polymers or copolymers of an acrylic acid or glycidyl methacrylate. Specific examples thereof include the compounds described in JP-A-2002-46361, paragraphs [0013] to [0014].

Examples of the compound having a vinyloxy group include compounds having a group represented by the following formula (XI):

Formula (XI)

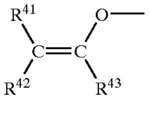

wherein $R^{41}$, $R^{42}$ and $R^{43}$, which may be the same or different, each represents hydrogen, an alkyl group or an aryl group and two of these may combine to form a saturated or olefinic unsaturated ring.

More specifically, in formula (XI), when any one of $R^{41}$, $R^{42}$ and $R^{43}$ is an aryl group, the aryl group generally has from 6 to 20 carbon atoms and may be substituted by an alkyl group, an aryl group, an alkoxy group, an aryloxy group, an acyl group, an acyloxy group, an alkylmercapto group, an acylamino group, an alkoxycarbonyl group, a nitro group, a sulfonyl group, a cyano group, a halogen atom or the like.

When any one of $R^{41}$, $R^{42}$ and $R^{43}$ is an alkyl group or an alkenyl group, the alkyl or alkenyl group is generally a linear, branched or alicyclic carbon chain having from 1 to 20 carbon atoms and may be substituted by a halogen atom, a cyano group, an alkoxycarbonyl group, a hydroxy group, an alkoxy group, an aryloxy group, an aryl group or the like. When two of $R^{41}$, $R^{42}$ and $R^{43}$ are combined to form a ring together with a carbon atom of the vinyl group, the ring is usually a 3-, 4-, 5-, 6-, 7- or 8-membered, preferably 5- or 6-membered, saturated or unsaturated ring.

In the present invention, among the vinyloxy groups represented by formula (XI), preferred is a vinyloxy group where any one of $R^{41}$, $R^{42}$ and $R^{43}$ is a methyl group or an ethyl group and others are a hydrogen atom; more preferred is a vinyloxy group (vinyl ether group) where all of $R^{41}$, $R^{42}$ and $R^{43}$ are a hydrogen atom.

The compound having a vinyloxy group is preferably a compound having two or more vinyloxy groups represented by formula (XI). When two or more vinyloxy groups are present, crosslinking can be effectively attained and the effects of the present invention can be easily obtained. This compound has a boiling point of 60° C. or more under atmospheric pressure and preferred examples thereof include the compounds having a vinyl ether group, represented by the following formulae (XII) and (XIII):

$$A^0\text{—}[\text{—O—}(R^{44}\text{—O})_g\text{—CH=CH}_2]_h \qquad \text{Formulae (XII)}$$

$$A^0\text{—}[\text{—}B^0\text{—}R^{44}\text{—O—CH=CH}_2]_h \qquad \text{Formulae (XIII)}$$

wherein $A^0$ represents an m-valent alkyl, aryl or heterocyclic group, $B^0$ represents —CO—O—, —NHCOO— or —NHCONH—, $R^{44}$ represents a linear or branched alkylene group having from 1 to 10 carbon atoms, g represents 0 or an integer of 1 to 10, and h represents an integer of 2 to 6.

The compound represented by formula (XII) can be synthesized by a method described, for example, in Stephen. C. Lapin, *Polymers Paint Colour Journal,* 179(4237), 321 (1988), namely, by a reaction of a polyhydric alcohol or phenol and an acetylene or a reaction of a polyhydric alcohol or phenol and a halogenated alkyl vinyl ether.

Specific examples thereof include the compounds described in JP-A-2002-29162, paragraphs [0021] to [0041].

The wall material of the microcapsule for use in the present invention is preferably polyurea, polyurethane, polyester, polycarbonate, polyamide or a mixture thereof, more preferably polyurea or polyurethane. As described above, a compound having a heat reactive group may be introduced into the outer wall of the microcapsule.

For the production of the microcapsule enclosing a compound having a heat reactive group, a known microencapsulation method can be applied. Examples of the microencapsulation method include a method utilizing coacervation described in U.S. Pat. Nos. 2,800,457 and 2,800,458, a method by interfacial polymerization described in British Patent 990,443, U.S. Pat. No. 3,287,154, JP-B-38-19574, JP-B-42-446 and JP-B-42-711, a method by precipitation of polymer described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde type or urea formaldehyde-resorcinol type wall-forming material described in U.S. Pat. Nos. 4,001,140, 4,087,376 and 4,089,602, a method using a wall material such as melamine-formaldehyde resin and hydroxy cellulose described in U.S. Pat. No. 4,025,445, an in situ method by monomer polymerization described in JP-B-36-9163 and JP-B-51-9079, a spray drying method described in U.S. Pat. No. 3,111,407, and an electrolytic dispersion cooling method described in British Patents 952,807 and 967,074, however, the present invention is not limited thereto.

The microcapsule of the present invention may be a microcapsule as described in JP-A-2001-27740 where the outer wall is ruptured by heat used for the image formation, or a microcapsule as described in JP-A-2001-277742 where the outer wall is not ruptured by heat used for the image formation. In the case of a microcapsule where the outer wall is not ruptured by heat, as described in JP-A-2001-277742, the outer wall is three-dimensionally crosslinked and a solvent for swelling the outer wall is added to the microcapsule dispersed solvent so that a heat reactive compound can be present in the outer wall. or on the microcapsule surface.

The image-forming layer of the present invention may contain, in addition to the microcapsule, a thermoplastic and/or heat-reactive fine particulate polymer described in JP-A-2001-293971. By the addition of this fine particulate polymer, the film strength in the image area can be more improved and the press life is prolonged.

The thermoplastic fine particulate polymer is preferably a fine particle of a thermoplastic polymer having a Tg of 60° C. or more (hereinafter, sometimes simply referred to as "a thermoplastic fine particulate polymer") and suitable examples thereof include thermoplastic fine particulate polymers described in *Research Disclosure*, No. 33303 (January, 1992), JP-A-9-123387, JP-A-9-131850, JP-A-9-171249, JP-A-9-171250 and EP 931,647. Specific examples thereof include homopolymers or copolymers of a monomer such as ethylene, styrene, vinyl chloride, methyl acrylate, ethyl acrylate, methyl methacrylate, ethyl methacrylate, vinylidene chloride, acrylonitrile and vinyl carbazole, and a mixture thereof. Among these, preferred are polystyrene and polymethyl methacrylate.

The heat reactive fine particulate polymer which can be used in the present invention has a heat reactive functional group.

Suitable examples of the heat reactive functional group include an ethylenically unsaturated group of performing a polymerization reaction (such as acryloyl group, methacryloyl group, vinyl group and allyl group), an isocyanate group of performing an addition reaction or a block form thereof and a functional group having an active hydrogen atom as the other party of the reaction (such as amino group, hydroxyl group and carboxyl group), an epoxy group of performing an addition reaction and an amino, carboxyl or hydroxyl group as the other party of the reaction, a carboxyl group of performing a condensation reaction and a hydroxyl or amino group, and an acid anhydride of performing a ring-opening addition reaction and an amino or hydroxyl group. However, as long as a chemical bond is formed, the functional group may perform any reaction.

Specific examples of the heat reactive fine particulate polymer contained in the image-forming layer of the lithographic printing plate precursor of the present invention include an acryloyl group, a methacryloyl group, a vinyl group, an allyl group, an epoxy group, an amino group, a hydroxy group, a carboxy group, an isocyanate group, an acid anhydride, and a group after protection thereof. This functional group may be introduced into the polymer particle at the polymerization of fine particulate polymer or may be introduced using a polymer reaction after the polymerization of fine particulate polymer.

In the case of introducing the functional group at the polymerization, a monomer having this functional group is preferably emulsion polymerized or suspension polymerized. Specific examples of the monomer having such a functional group include allyl methacrylate, allyl acrylate, vinyl methacrylate, vinyl acrylate, glycidyl methacrylate, glycidyl acrylate, 2-isocyanate ethyl methacrylate or a block isocyanate thereof with an alcohol or the like, 2-isocyanate ethyl acrylate or a block isocyanate thereof with an alcohol or the like, 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate and bifunctional methacrylate, however, the present invention is not limited thereto. Examples of the monomer having no heat reactive functional group, which can be copolymerized with the above-described monomer, include styrene, alkyl acrylate, alkyl methacrylate, acrylonitrile and vinyl acetate, however, the monomer is not limited thereto and is sufficient if it has no heat reactive functional group.

Examples of the polymer reaction used in the case of introducing the heat reactive functional group after the polymerization of fine particulate polymer include the polymer reaction described in WO96-34316.

The average particle size of the thermoplastic or heat reactive fine particulate polymer is preferably from 0.01 to 20 $\mu$m, more preferably from 0.05 to 2.0 $\mu$m, most preferably from 0.1 to 1.0 $\mu$m. If the average particle size is excessively large, poor resolution results, whereas if it is too small, the aging stability becomes bad.

The amount of the fine particulate polymer added is preferably from 1 to 50 weight %, more preferably from 5 to 30 weight %, based on the solid content of the image-forming layer.

The image-forming layer of the present invention contains a light-heat converting substance so as to convert the light energy into heat energy with good efficiency. The light-heat converting substance is not particularly limited and any substance can be used as long as it can absorb light such as ultraviolet light, visible light and infrared light and convert the light into heat. The light-heat converting substance is preferably a dye, pigment or metal which effectively absorbs infrared light at a wavelength of 760 to 1,200 nm.

Preferred examples of the dye include cyanine dyes described in JP-A-58-125246, JP-A-59-84356, JP-A-60-78787, JP-A-10-268512 and U.S. Pat. No. 4,973,572, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, cyanine dyes described in British Patent 434,875, phthalocyanine (including metal-containing phthalocyanine) dyes described in JP-A-11-235883 and JP-A-2000-352817, near infrared absorbing sensitizers described in U.S. Pat. No. 5,156,938, substituted arylbenzo(thio)pyrylium salts described in U.S. Pat. No. 3,881,924, oxonol dyes described in JP-A-2000-347393, trimethinethiapyrylium salts described in JP-A-57-142645 (U.S. Pat. No. 4,327,169), pyrylium-base compounds described in JP-A-58-181051, JP-A-58-220143, JP-A-59-41363, JP-A-59-84248, JP-A-59-84249, JP-A-59-146063, JP-A-59-146061 and JP-A-2000-330271, cyanine dyes described in JP-A-59-216146, JP-A-11-119421, JP-A-2001-125260 and JP-A-2001-117261, pentamethinethiopyrylium salts described in U.S. Pat. No. 4,283,475, pyrylium compounds described in JP-B-5-13514 and JP-B-5-19702, organic metal complexes described in JP-A-58-224796 and JP-A-11-338131, and near infrared absorbing dyes represented by formulae (I) and (II) of U.S. Pat. No. 4,756,993.

Among these, preferred are cyanine dyes, squarylium dyes, pyrylium salts and organic metal salts (phthalocyanine, dithiolate complex).

As the pigment, commercially available pigments and pigments described in *Color Index* (*C.I.*) *Binran* (*C.I. Handbook*), *Saishin Ganryo Binran* (*Newest Pigment Handbook*), edited by Nippon Ganryo Gijutsu Kyokai (1977), *Saishin Ganryo Oyo Gijutsu* (*Newest Pigment Application Technology*), CMC (1986), and *Insatsu Ink Gijutsu* (*Printing Ink Technology*), CMC (1984) may be used. Specific examples of the pigment which can be used include insoluble azo pigments, azo lake pigments, condensed azo pigments, chelate azo pigments, phthalocyanine-base pigments, anthraquinone-base pigments, perylene- and perynone-base pigments, thioindigo-base pigments, quinacridone-base pigments, dioxazine-base pigments, isoindolinone-base pigments, quinophthalone-base pigments, dyed lake pigments, azine pigments, nitroso pigments, nitro pigments, natural pigments, fluorescent pigments, inorganic pigments and carbon black. The pigment may not be surface-treated before use or may be subjected to a known surface treatment and then used. Among these pigments, carbon black is preferred.

As the metal fine particle, metal fine particles described in JP-A-2001-205952 are preferred. More specifically, Ag, Au, Cu, Sb, Ge and Pb are preferred, and Ag, Au and Cu are more preferred.

The light-heat converting substance may be incorporated into the microcapsule in the image-forming layer or into the outside of microcapsule. In the case of incorporating the light-heat substance into a hydrophobic substance in the microcapsule, a lipophilic light-heat converting substance is preferred and in the case of incorporating the light-heat converting substance into the hydrophilic matrix outside the microcapsule, a water-soluble or hydrophilic light-heat converting substance is preferred. Also, in order to attain higher sensitivity, the light-heat converting substance may be added to the hydrophilic layer in addition to the image-forming layer.

This dye or pigment can be used in a ratio of, based on the solid content of the image-forming layer, from 0.01 to 50 weight %, preferably from 0.1 to 10 weight % and in the case of dye, still more preferably from 0.5 to 10 weight % or in the case of pigment, still more preferably from 3.1 to 10 weight %. The amount of the metal fine particle added is preferably 10 weight % or more of the entire solid content in the image-forming layer.

In the image-forming layer of the present invention, a binder polymer (hereinafter sometimes referred to as a binder polymer (H)) may be added so as to improve the on-press developability or increase the film strength of the image-forming layer. The binder polymer (H) is preferably a polymer which is not three-dimensionally crosslinked, because good on-press developability can be obtained. The image-forming layer of the present invention may have a form where the microcapsule is dispersed in the binder polymer or a form where the microcapsule is bound to the binder polymer and fixed to the hydrophilic layer.

The binder polymer (H) is preferably a polymer having a hydrophilic group such as hydroxyl group, carboxyl group, hydroxyethyl group, hydroxypropyl group, amino group, aminoethyl group, aminopropyl group and carboxymethyl group.

Specific examples of the binder polymer (H) include gum arabi, casein, gelatin, soya gum, starch and derivatives thereof, cellulose derivatives (such as hydroxyethyl cellulose, hydroxypropyl cellulose, methyl cellulose, carboxymethyl cellulose and salts thereof, and cellulose acetate), alginic acid and alkali metal salts, alkaline earth metal salts or ammonium salts thereof, water-soluble urethane resin, water-soluble polyester resin, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene oxides, poly(propylene oxides), polyvinyl alcohols (PVA), hydrolyzed polyvinyl acetate having a hydrolysis degree of at least 60 weight %, preferably at least 80 weight %, polyvinyl formal, polyvinyl butyral, polyvinylpyrrolidone, homopolymers and copolymers of acrylamide, homopolymers and copolymers of methacrylamide, homopolymers and copolymers of N-methylolacrylamide, and 2-acrylamide-2-methylpropanesulfonic acid and salts thereof.

Other examples of the binder polymer (H) suitable for the present invention include hydrophilic graft polymers, The hydrophilic graft polymer indicates a graft polymer having a side chain formed of a polymer or copolymer containing, as a polymerization component, a monomer having a hydrophilic group (hereinafter sometimes referred to as a hydrophilic monomer). The copolymerization percentage of the hydrophilic monomer in the side chain copolymer is preferably 50 mol % or more, more preferably 80 mol % or more. The main chain may be formed of a hydrophilic monomer or a hydrophobic monomer or may be formed of both a hydrophilic monomer and a hydrophobic monomer.

Examples of the hydrophilic group include a carboxyl group and salts thereof, a carboxylic acid anhydride group, a sulfonic acid group and salts thereof, an amide group and a polyethyleneoxy group.

The monomer for use in the side chain may be any if it is a monomer having the above-described hydrophilic group but preferred examples thereof include an acrylic acid, a methacrylic acid, a maleic anhydride, an itaconic acid, an acrylamide, an N-alkylacrylamide (the alkyl group has from 1 to 6, preferably from 1 to 3, carbon atoms), a styrenesulfonic acid, a 2-acrylamido-2-methylpropanesulfonic acid, a vinylpyrrolidone and a monomer containing a polyethyleneoxy group. The acids each may be a salt thereof. Among these monomers, an acrylamide is preferred because its synthesis is easy.

The weight average molecular weight of the side chain hydrophilic monomer polymer is preferably from 1,000 to 50,000, and the weight average molecular weight of the hydrophilic graft polymer is preferably from 5,000 to 500,000. Within this range, good on-press developability and long press life can be obtained.

The hydrophilic graft polymer can be obtained by polymerizing a macromonomer having a radical-polymerizable functional group at one terminal of a hydrophilic monomer polymer, such as acrylamide macromonomer, or copolymerizing this macromonomer and a monomer copolymerizable therewith.

In the image-forming layer of the present invention, a mixture of the hydrophilic graft polymer and the non-grafted hydrophilic resin may be used as the binder polymer (H), if desired.

The amount of the binder. polymer (H) added to the image-forming layer is preferably from 2 to 40 weight % based on the solid content of the image-forming layer.

Within this range, good on-press developability and long press life can be obtained.

Other than those described above, various compounds may be added, if desired, to the image-forming layer of the lithographic printing plate precursor of the present invention so as to obtain various properties. These compounds are described below.

In the image-forming layer of the present invention, a compound which initiates or accelerates the reaction of the heat reactive functional group may be added. Examples of this compound include compounds capable of generating a radical or a cation by heat, such as lophine dimer, trihalomethyl compound, peroxide, azo compound, onium salt including diazonium salt and diphenyl iodonium salt (e.g., diazodiphenylamine), acylphosphine and imidosulfonate. This compound can be added to the image-forming layer in an amount of 1 to 20 weight %, preferably from 3 to 10 weight %. Within this range, good effect of initiating or accelerating the reaction can be obtained without impairing the on-press developability or press life.

Particularly, in the case of a compound having a radical polymerizable group, a photo-radical generator is preferably used in combination, and in the case of a compound having an epoxy or vinyloxy group, an acid precursor is preferably used in combination.

The heat-radical generator which is preferably used in combination with the radical polymerizable compound is described below. The radical generator indicates a compound which generates a radical by the light energy, heat energy or both energies to initiate or accelerate the polymerization of a compound having a polymerizable unsaturated group. The radical generator for use in the present invention can be selected from known thermal polymerization initiators and compounds having a small total energy of bonding and dissociation, and examples thereof include onium salts, organic halogen compounds such as s-triazine compound having a trihalomethyl group and oxazole compound, peroxides, azo-type polymerization initiators, arylazide compounds, carbonyl compounds such as benzophenones, acetophenones and thioxanthones, metallocene compounds, hexaarylbiimidazole compounds, organic borate compounds and disulfone compounds.

Specific examples of the onium salt include diazonium salts described in S. I. Schlesinger, *Photogr. Sci. Eng.*, 18, 387 (1974), T. S. Bal et al., *Polymer*, 21, 423 (1980), etc., ammonium salts described in U.S. Pat. Nos. 4,069,055 and 4,069,056 JP-A-3-140140, etc., phosphonium salts described in D. C. Necker et al., *Macromolecules*, 17, 2468 (1984), C. S. Wen et al., *Teh. Proc. Conf. Rad. Curing ASIA*, p. 478, Tokyo, October (1988), U.S. Pat. Nos. 4,069,055 and 4,069,056, etc., iodonium salts described in J. V. Crivello et al., *Macromolecules*, 10 (6) 1307 (1977), *Chem. & Eng. News*, November 28, p. 31 (1988), European Patent 104,143, U.S. Pat. Nos. 339,049 and 410,201, JP-A-2-150848, JP-A-2-296514, etc., sulfonium salts described in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci.*, Polymer Chem. Ed., 17, 2877 (1979), European Patent 370,693, U.S. Pat. No. 3,902,114, European Patents 233,567, 297,443 and 297,442, U.S. Pat. No. 4,933,377, European Patents 410,201 and 339,049, U.S. Pat. Nos. 4,760,013, 4,734,444 and 2,833,827, German Patents 2,904,626, 3,604,580 and 3,604,581, etc., selenonium salts described in J. V. Crivello et al., *Macromolecules*, 10 (6), 1307 (1977), J. V. Crivello et al., *J. Polymer Sci.*, Polymer Chem. Ed., 17, 1047 (1979), etc., and arsonium salts described in C. S. Wen et al., *Teh. Proc. Conf. Rad. Curing ASIA*, p. 478, Tokyo, October (1988), etc.

Examples of the organic halogen compounds include the compounds described in Wakabayashi et al., *Bull. Chem. Soc. Japan,* 42, 2924 (1969), U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, M. P. Hutt et al., *J. Heterocycl. Chem.*, 7 (No. 3) (1970), etc., particularly, oxazole compounds substituted with a trihalomethyl group and s-triazine compounds.

Examples of the metallocene compound include various titanocene compounds described in JP-A-59-152396, JP-A-61-151197, JP-A-63-41484, JP-A-2-249, JP-A-2-4705 and JP-A-5-83588, and examples of the hexaarylbiimidazole compound include various compounds described in JP-B-6-29285 and U.S. Pat. Nos. 3,479,185, 4,311,783 and 4,622,286, and iron-allene complexes described in JP-A-1-304453 and JP-A-1-152109.

Examples of the organic borate compound include organic borates described in JP-A-62-143044, JP-A-62-150242, JP-A-9-188685, JP-A-9-188686, JP-A-9-188710, Japanese Patent No. 2764769, Japanese Patent Application No. 2000-310808 previously filed by the present applicant, and Martin Kunz, *Rad Tech.* '98. *Proceeding April* 19–22 *Chicago*, etc., organic boron sulfonium complex salts and organic boron oxosulfonium complex salts described in JP-A-6-157623, JP-A-6-175564, JP-A-6-175561, etc., organic boron phosphonium complexes described in JP-A-6-175554 and JP-A-6-175553, and organic boron transition metal coordination complexes described in JP-A-6-348011, JP-A-7-128785; JP-A-7-140589, JP-A-7-3062527, JP-A-7-292014, etc.

Examples of the disulfone compound include compounds described in JP-A-61-166544 and Japanese Patent Application No. 2001-132318 filed by the present applicant.

The radical generator particularly suitably used in the present invention is an onium salt and preferred examples thereof include onium salts represented by the following formulae (VII) to (IX).

(VII)

$$Ar^{11}-I^{+}-Ar^{12} \qquad Z^{11-}$$

(VIII)

$$Ar^{21}-N^{+}\equiv N \qquad Z^{21-}$$

(IX)

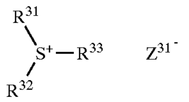

In formula (VII), $Ar^{11}$ and $Ar^{12}$ each independently represents an aryl group having 20 or less carbon atoms, which may have a substituent. When the aryl group has a substituent, preferred examples of the substituent include a halogen atom, a nitro group, an alkyl group having 12 or less carbon atoms, an alkoxy group having 12 or less carbon atoms, and an aryloxy group having 12 or less carbon atoms. $Z^{11-}$ represents an inorganic anion or an organic anion.

In formula (VIII), $Ar^{21}$ represents an aryl group having 20 or less carbon atoms, which may have a substituent. Preferred examples of the substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms. $Z^{21-}$ represents a counter ion having the same meaning as $Z^{11-}$.

In formula (IX), $R^{31}$, $R^{32}$ and $R^{33}$, which may be the same or different, each represents a hydrocarbon group having 20 or less carbon atoms, , which may have a substituent. Preferred examples of the substituent include a halogen atom, a nitro group, an alkyl group having 12 or less carbon atoms, an alkoxy group having 12 or less carbon atoms, and an aryl group having 12 or less carbon atom. $Z^{31}$ represents a counter ion having the same meaning as $Z^{11-}$.

$Z^{11-}$, $Z^{21-}$ and $Z^{31-}$ in formulae (VII) to (IX) each represents an organic anion or an organic anion and examples of the inorganic anion include halogen ion (e.g., $F^-$, $Cl^-$, $Br^-$, $I^-$), perchlorate ion ($ClO_4^-$), perbromate ion ($BrO_4^-$), tetrafluoroborate ion ($BF_4^-$), $SbF_6^-$ and $PF_6^-$. Examples of the organic anion include-organic borate anion, sulfonate ion, phosphonate ion, oxyphosphonate ion, carboxylate ion, $R^{40}SO_2^-$, $R^{40}SO_2S^-$, $R^{40}SO_2N$—Y—$R^{40}$ ion (wherein $R^{40}$ represents an alkyl group having from 1 to 20 carbon atoms or an aryl group having 6 to 20 carbon atoms, and Y represents a single bond, —CO— or —$SO_2$—) and 5-coordination silane compound ion represented by the following formula (X).

Formula (X)

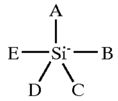

In the above, $R^{40}$ may have a ring structure, and the alkyl group and the aryl group each may further have a substituent. Specific example of the substituent which can be introduced include an alkyl group, an alkoxy group, an alkenyl group, an alkynyl group, an amino group, a cyano group, a hydroxy group, a halogen atom, an amido group, an ester group, a carbonyl group and a carboxy group. These substituents each may further have the above-described substituent. Also, two or more substituents may combine with each other to form a ring and the ring structure may be a heterocyclic structure containing a nitrogen atom, a sulfur atom or the like. In view of suitability for synthesis, $R^{40}$ is preferably an aryl group.

In the 5-coordination silane compound ion represented by formula (X), A, B, C, D and E each independently represents a monovalent nonmetallic atom. In the formula, A, B, C, D and E, which independently represent a monovalent, each is preferably a hydrogen atom, an alkyl group having from 1 to 10 carbon atoms, an aryl group having from 6 to 10 carbon atoms, an alkenyl group, an alkynyl group, an alkoxy group, a phenoxy group, an amino group, a vinyl group, an allyl group, a cyano group or a halogen atom. These groups each may further have one substituent or two or more substituents. Preferred examples of the substituent include a halogen atom, a linear or branched alkyl group having from 1 to 8 carbon atoms, an aryl group, an alkenyl group, a carbonyl group, a carboxy group, an amido group, an acetyl group, an ether group, a thioether group, an ester group, an amino group, and a combination of two or more thereof. Out of A, B, C, D and E, adjacent nonmetallic atoms may combine with each other to form a ring.

Among these 5-coordination silane compound ions, preferred is the compound ion where any one of A, B, C, D and E is a halogen atom, an aryl group or an alkoxy group, more preferred is the compound ion where any one or more of A, B, C, D and E is a fluorine atom.

Specific examples of the onium salt which can be suitably used in the present invention include those described in JP-A-2001-133696, paragraphs [0030] to [0033].

The onium ion for use in the present invention preferably has a maximum absorption wavelength of 400 nm or less, more preferably 360 nm or less. By having the absorption wavelength in the ultraviolet region as such, the lithographic printing plate precursor can be handled under white light.

The onium salt can be added to the image-forming layer in a ratio of 0.1 to 50%, preferably from 0.5 to 30%, more preferably from 1 to 20%, to the entire solid content of the image-forming layer. Within this range, good sensitivity can be obtained without causing staining in the non-image area at the printing.

One of these onium salts may be used alone or two or more thereof may be used in combination. The onium salt may be contained in the microcapsule or fine particle. In this case, a water-insoluble onium salt is preferred. In the case of not incorporating in the microcapsule or fine particle, a water-soluble onium salt can be used.

The acid precursor which is preferably used together with the compound having an epoxy or vinyloxy group is described below.

The acid precursor for use in the present invention can be appropriately selected from known compounds which thermally compose to generate an acid, such as photoinitiators for photo-cationic polymerization, photoinitiators for photo-radical polymerization, photo-decoloring agents for dyes, photo-discoloring agents and known acid generators used for microresist or the like, and a mixture thereof.

Examples thereof include onium salts such as diazonium salt, ammonium salt, phosphonium salt, iodonium salt, sulfonium salt, selenonium salt and arsonium salt, organic halogen compounds, metallocene compounds, titanocene compounds, hexaarylbiimidazole, iron-allene compounds and organic boric acid compounds. Specific examples include those described above for the heat-radical generator.

Other examples include organic metals/organic halides described in JP-A-2-161445; photoacid generators having an o-nitrobenzyl type protective group described in D. H. Barton et al., *J. Chem. Soc.*, 3571 (1965), J. W. Walker et al., *J. Am. Chem. Soc.*, 11, 7170 (1988), European Patents 0,290,750, 046,083, 156,535, 271,851, and 0,388,343, U.S. Pat. Nos. 3,901,710 and 4,181,531, JP-A-60-198538 and JP-A-53-133022; compounds which are photochemically decomposed to generate a sulfonic acid, represented by iminosulfonate, described in European Patents 0,199,672, 84,515, 199,672, 044,115 and 0,101,122, U.S. Pat. Nos. 4,618,564, 4,371,605 and 4,431,774, JP-A-64-18143, JP-A-2-245756 and Japanese patent Application No. 3-140109; and disulfone compounds described in JP-A-61-166544.

Also, a compound where such a group or compound capable of generating an acid is introduced in the main or side chain of a polymer may be used and examples thereof include compounds described in M. E. Woodhouse et al., *J. Am. Chem. Soc.*, 104, 5586 (1982), S. P. Pappas et al., *J. Imaging Sci.*, 30(5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent 3,914,407, JP-A-63-26653, JP-A-55-164824, JP-A-62-69263, JP-A-63-1460387, JP-A-63-163452, JP-A-62-153853 and JP-A-63-146029.

Furthermore, compounds which generate an acid by light, described in V. N. R. Pillai, *Synthesis*, (1), 1 (1980), A. Abad et al., *Tetrahedron Lett*., (47) 4555 (1971, D. H. R. Barton et al., *J. Chem. Soc*., (C), 329 (1970), U.S. Pat. No. 3,779, 778 and European Patent 126,712, can also be used.

Specific examples thereof include Compounds (A1) to (A20) described in JP-A-2002-29162, paragraphs [0063] to [0064], however, the present invention is not limited thereto.

The amount of the acid precursor added is preferably from 0.01 to 20 weight %, more preferably from 0.1 to 10 weight %, based on the entire solid content in the image-forming layer.

In the image-forming layer of the lithographic printing plate precursor of the present invention, a crosslinking agent precursor compound which has a protected reactive functional group and can exhibit reactivity under heat can be used. The crosslinking agent precursor compound may be a compound which is deprotected by thermal decomposition or a compound which is deprotected by a reaction such as nucleophilic reaction in the presence of an acid or base catalyst. Examples thereof include compounds where an isocyanate group is blocked by a phenol, a β-diketone compound, a lactam, an oxime, a tertiary alcohol, an aromatic amine, an amide, a thiol, a heterocyclic compound, a ketoxime or the like; compounds where a carboxy group is ester-protected by a tetrahydropyranyl group, a tert-butyl group, a tert-butyldimethylsilyl group, an N-phthalimidomethyl group, a cinnamyl group, or the like; and compounds where a hydroxy group is etherified by a trimethylsilyl group, a triisopropylsilyl group, a tetrahydropyranyl group or the like. As the amine precursor, known decarboxylation type, thermal decomposition type, reaction type such as intramolecular nucleophilic substitution reaction, Lossen rearrangement and Beckman rearrangement, and complex salt-forming type are used. Other examples include amineimide compounds, dicyanamide compound, carbazides, $BF_3$ amine complexes, and arylsulfonylacetates such as phenylsulfonylacetate and 4-(phenylsulfonyl)phenylsulfonylacetate. In addition, compounds which generate an amine under heat or by a reaction, described as a base precursor in JP-A-62-26404, JP-A-5-34909, JP-A-5-68873 and the like, can be used. In the case of introducing such a compound into the microcapsule, the compound may be dissolved or solid-dispersed in a hydrophobic solvent or may be dispersed in water and in this state, emulsified in a hydrophobic solvent.

In the image-forming layer of the present invention, an inorganic fine particle may be added. Suitable examples of the inorganic fine particle include silica, alumina, magnesium oxide, titanium oxide, magnesium carbonate, calcium alginate and a mixture thereof. This inorganic fine particle, even if it has no light-heat converting property, can be used for strengthening the film or intensifying the interface adhesion by surface roughening.

The average particle size of the inorganic fine particle is preferably from 5 nm to 10 μm, more preferably from 10 nm to 1 μm. With a particle size in this range, the inorganic fine particle can be stably dispersed in an organic and inorganic composite material together with the fine particulate polymer or metal fine particle as a light-heat converting substance, whereby a sufficiently high film strength of the image-forming layer can be maintained and a non-image area having excellent hydrophilicity and less liable to cause printing stain can be formed. Such an inorganic fine particle can be easily available as a colloidal silica dispersion or the like on the market.

The content of the inorganic fine particle in the image-forming layer is preferably from 1.0 to 70 weight %, more preferably from 5.0 to 50 weight %, of the entire solid content of the image-forming layer.

Examples of the surfactant for use in the image-forming layer include, in addition to a nonionic surfactant and an anionic surfactant, cationic or fluorine-containing surfactants described in JP-A-2-195356 and amphoteric surfactants described in JP-A-59-121044 and JP-A-4-13149. The amount of the surfactant added is preferably from 0.05 to 15 weight %, more preferably from 0.1 to 5 weight %, of the solid content in the hydrophilic layer.

Furthermore, in the image-forming layer of the present invention, a dye having large absorption in the visible region can be used as an image coloring agent so that after the image formation, the image area and the non-image area can be easily distinguished. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all are produced by Orient Kagaku Kogyo K.K.), Victoria Pure Blue, Crystal Violet (CI42555), Methyl Violet (CI42535), Ethyl Violet, Rhodamine B (CI1451705B), Malachite Green (CI42000), Methylene Blue (CI52015) and dyes described in JP-A-62-293247. Furthermore, pigments such as phthalocyanine-type pigment, azo-type pigment and titanium oxide can also be suitably used. The amount added is from 0.01 to 10 weight % based on the entire solid content of the image-forming layer.

In forming the image-forming layer of the present invention, necessary components described above are dissolved or dispersed in water or, if desired, in a mixed solvent having added thereto an organic solvent, and the coating solution prepared is coated using any conventionally known coating method and then dried. The coated amount (solid content) of the image-forming layer varies depending on use but in general, is preferably from 0.1 to 30 g/$m^2$, more preferably from 0.3 to 10 g/$m^2$, still more preferably from 0.3 to 5 g/$m^2$.

Water-Soluble Protective Layer

The surface of the image-forming layer of the present invention is hydrophilic and therefore, during the transportation or storage of the printing plate precursor in the form of a commercial product or at the handling before use, may be hydrophobized due to the effect of environmental atmosphere or is readily affected by the temperature or humidity or susceptible to mechanical scratch or staining. For preventing these, in the lithographic printing plate precursor of the present invention, a water-soluble protective layer mainly comprising a water-soluble polymer is preferably provided. However, the surface protective layer is not essential to the present invention.

Since this water-soluble protective layer is dissolved by a fountain solution and washed away at the initial stage of printing, a step for its removal is not necessary and printing is not disturbed. The components contained in the water-soluble protective layer are described below.

The water-soluble polymer contained in the water-soluble protective layer functions as a binder of the water-soluble layer. Examples of the water-soluble polymer include polymers sufficiently having a hydroxyl group, a carboxy group, a basic nitrogen-containing group or the like.

Specific examples thereof include polyvinyl alcohol (PVA), modified PVA (e.g., carboxy-modified PVA), gum arabi, water-soluble soybean polysaccharides, polyacrylamide, copolymers of acrylamide, polyacrylic acid, acrylic acid copolymers, vinyl methyl ether/maleic anhydride copolymers, vinyl acetate/maleic anhydride copolymers, styrene/maleic anhydride copolymers, roasted dextrin, oxygen decomposed dextrin, enzymolyzed etherified dextrin, starch and derivatives thereof, cellulose derivatives (e.g., carboxymethyl cellulose, carboxyethyl cellulose, methyl cellulose, hydroxyethyl cellulose), casein, gelatin, polyvinylpyrrolidone, vinyl acetate-crotonic acid copolymers, styrene-maleic acid copolymers, alginic acid and alkali metal salts, alkaline earth metal salts or ammonium salts thereof, polyacrylic acid, poly(ethylene oxide), water-soluble urethane resin, water-soluble polyester resin, polyhydroxyethyl acrylate, polyethylene glycol, polypropylene glycol and N-vinylcarboxylic acid amide polymers. Among these, preferred are polyvinyl alcohol (PVA), modified PVA (e.g., carboxy-modified PVA), gum arabi, polyacrylamide, polyacrylic acid, acrylic acid copolymers, polyvinylpyrrolidone, and alginic acid and alkali metal salts thereof. In the present invention, these water-soluble resins may be used as a mixture of two or more thereof.

The content of the water-soluble resin in the coating solution is suitably from 3 to 25 weight %, preferably from 10 to 25 weight %.

As for other components of the water-soluble protective components, a surfactant of various types may be contained. Examples of the surfactant which can be used include an anionic surfactant and a nonionic surfactant. Specific examples thereof include those described above for the surfactant for use in the image-forming layer. The amount of the surfactant added is preferably from 0.01 to 1 weight %, more preferably from 0.05 to 0.5 weight %, based on the entire solid content of the water-soluble layer.

In addition to these components, a lower polyhydric alcohol such as glycerin, ethylene glycol and triethylene glycol can be used as a wetting agent, if desired. The wetting agent is suitably used in an amount of giving a content of 0.1 to 5.0 weight %, preferably from 0.5 to 3.0 weight %, in the surface protective layer. other than these, the coating solution for the surface protective layer of the lithographic printing plate precursor of the present invention may contain an antiseptic or the like. For example, benzoic acid or a derivative thereof, phenol, formalin, sodium dehydroacetate or the like may be added in an amount of 0.005 to 2.0 weight %. A defoaming agent may be also added to the coating solution. Preferred examples of the defoaming agent include organic silicone compounds. The amount of the defoaming agent added is preferably from 0.0001 to 0.1 weight %.

Furthermore, the water-soluble protective layer may contain a light-heat converting substance. As the light-heat converting substance, the material described for the image-forming layer can be used in the same added amount range.

The coated amount (solid content) of the water-soluble protective layer is preferably from 0.1 to 5 g/m$^2$, more preferably from 0.2 to 3 g/m$^2$.

Water-Resistant Support

The water-resistant support for use in the present invention is described below. Examples of the water-resistant support include bimetal plates such as aluminum plate, zinc plate, copper-aluminum plate, copper-stainless steel plate and chromium-copper plate, and trimetal plates such as chromium-copper-aluminum plate, chromium-lead-iron plate and chromium-copper-stainless steel plate, which have a thickness of 0.1 to 3 mm, preferably from 0.1 to 1 mm. Also, paper, plastic film (e.g., cellulose diacetate, cellulose triacetate, cellulose propionate, cellulose butyrate, cellulose acetate butyrate, polyethylene terephthalate, polyethylene, polystyrene, polypropylene, polycarbonate, polyvinyl acetal), or metal foil-laminated paper or plastic, which has a thickness of 80 to 200 $\mu$m and is subjected to a water-resistant treatment, may be used.

This support may be subjected to a known surface processing so as to intensify the adhesive strength to the layer coated thereon. In the case of a plastic film, examples of the surface processing include surface treatments such as corona discharge treatment, plasma treatment, blast treatment, coating of an acrylic, urethane-base, cellulose-base or epoxy-base adhesive on the support, and coating of an undercoat layer, namely, polyvinyl alcohol, a homopolymer or copolymer of hydroxyalkyl acrylate or methacrylate, or hydrolyzed tetraethyl orthosilicate or tetramethyl orthosilicate, and suitably another layer containing fine particles of silicon dioxide and/or titanium dioxide on a support surface described in JP-A-6-316183, JP-A-8-272088, JP-A-9-179311 and JP-A-2001-199175. In the case of a metal support, known surface treatment techniques can be used. For example, the surface processing of an aluminum support may be performed by a known surface treatment technique such as surface roughening, anodization, enlargement of anodization pores, sealing of pores and surface hydrophilization.

In the case of a metal support, a heat insulating layer may also be provided as an undercoat so as to prevent heat diffusion to the support and attain high sensitivity. This heat insulating layer contains an organic or inorganic resin as the main component. The organic or inorganic resin can be widely selected from known hydrophobic polymers, hydrophilic polymers, crosslinked hydrophilic polymers and inorganic polymers from a compound of undergoing a sol-gel conversion such as aluminum, silicon, titanium or zirconium having a hydroxyl group or an alkoxy group.

Exposure and Printing

On the lithographic printing plate precursor of the present invention, an image is formed by heat. More specifically, direct imagewise recording using a thermal recording head or the like, scan exposure by an infrared laser, high illuminance flash exposure by a xenon discharge lamp, or an infrared lamp exposure is used. In particular, the exposure is preferably performed using a solid-state high output infrared laser of radiating an infrared ray at a wavelength of 700 to 1,200 nm, such as semiconductor laser and YAG laser.

The lithographic printing plate precursor of the present invention can be irradiated by a laser having a laser output of 0.1 to 300 W. In the case of using a pulse laser, the laser for irradiation preferably has a peak output of 1,000 W, more preferably 2,000 W. In this case, the exposure amount is preferably such that the surface exposure intensity before modulation by the image for printing is from 0.1 to 10 J/cm$^2$, more preferably from 0.3 to 1 J/cm$^2$. In the case of a transparent support, the exposure may also be performed through the support by irradiating the laser from the back side of the support.

The imagewise exposed lithographic printing plate precursor of the present invention is fixed on an impression cylinder of a press without being subjected to any more treatment, on-press developed by a normal printing initiating operation of supplying a fountain solution and ink and further feeding paper, and then used for printing.

The lithographic printing plate precursor of the present invention may also be used for a system where the printing plate precursor is fixed on a plate cylinder of a press, exposed by a laser mounted on the press, on-press developed and then used for printing.

Furthermore, the lithographic printing plate precursor of the present invention may also be subjected to a liquid development processing using water or an appropriate aqueous solution as the developer after exposure and then used for printing.

EXAMPLES

The present invention is described in greater detail below by referring to Examples, however, the present invention is not limited thereto.

Production Example of Support

A coating solution for undercoating having the following composition was coated on a corona-treated polyethylene terephthalate (PET) film (thickness: 180 μm, produced by Toray Industries, Inc.) and dried to prepare a PET support with an undercoat layer having a dry coated weight of 1.0 $g/m^2$.

Coating Solution for Undercoating

| | |
|---|---|
| Methanol silica (produced by Nissan Chemicals Industries, Ltd., 30% methanol dispersion solution) | 0.75 g |
| Titanium dioxide dispersion (prepared by the method described below, solid content: 27%) | 1.20 g |
| Sol-gel solution (prepared by the method described below) | 0.66 g |
| A 4% aqueous solution of PVA117 (polyvinyl alcohol, produced by Kuraray Co., Ltd., saponification degree: 98.5%) | 0.38 g |
| A 3% aqueous solution of S-113 (fluorine-containing surfactant, produced by Asahi Glass Company, Ltd.) | 0.25 g |
| Methanol | 2.93 g |
| Water | 8.65 g |

Preparation Method of Titanium Dioxide Dispersion

In 100 ml-volume glass bottle, 6.00 g of titanium dioxide powder (produced by Aldrich, rutile), 15.00 g of a 4% aqueous solution of PVA117 and 3.00 g of water were charged and after filling 3 mmϕ glass beads, stirred by a paint shaker for 20 minutes to prepare a dispersion solution.

Preparation Method of Sol-Gel Solution

A mixed solution containing 8.47 g of tetramethoxysilane (LS540, produced by Shin-Etsu Silicone Co., Ltd.), 1.82 g of methanol, 14.5 g of water and 0.28 g of phosphoric acid (0.1 mol/liter) was ripened at room temperature for 2 hours to prepare a sol-gel solution.

Preparation Example of Hydrophobizing Precursor

As the oil phase component, 30 g of polymethyl methacrylate and 0.5 g of anionic surfactant Pionin A-41C (produced by Takemoto Oil & Fat Co., Ltd.) were dissolved in a mixed solvent containing 75 g of ethyl acetate and 30 g of methyl ethyl ketone. As the aqueous phase component, 100 g of a 4% aqueous solution of polyvinyl alcohol (PVA205, produced by Kuraray Co., Ltd., saponification degree: 88%) was prepared. The oil phase component and aqueous phase component were emulsified using a homogenizer at 10,000 rpm. Thereafter, 80 g of water was added thereto and the solution was stirred at room temperature for 30 minutes and further at 40° C. for 3 hours. The solid content concentration of the thus-obtained polymer fine particle dispersion solution was 16% and the average particle size of fine particles was 0.23 μm.

Synthesis of Hydrophilic Organic Polymer (B-1)

In a three-neck flask, 25 g of acrylamide, 3.5 g of 3-mercaptopropyltrimethoxysilane and 51.3 g of dimethylformamide were charged and heated to 65° C. in a nitrogen stream. Thereto, 0.25 g of 2,2'-azobis(2,4-dimethylvaleronitrile) was added and the reaction was started. After stirring for 6 hours, the reaction solution was cooled to room temperature and poured in 1.5 liter of ethyl acetate, as a result, the polymer was precipitated as a solid. After the filtration, the polymer was thoroughly washed with ethyl acetate and dried (yield: 21 g). By GPC (polystyrene standard), the mass average molecular weight was found to be 5,000.

Synthesis Example of Microcapsule

As the oil phase component, 40 g of xylylene diisocyanate, 10 g of trimethylolpropane diacrylate, 10 g of a copolymer of allyl methacrylate and butyl methacrylate (molar ratio:60/40) and 10 g of Pionin A-41C (produced by Takemoto Oil & Fat Co., Ltd.) were dissolved in 60 g of ethyl acetate. As the aqueous phase component, 120 g of a 4% aqueous solution of PVA205 (produced by Kuraray Co., Ltd.) was prepared. The oil phase component and aqueous phase component were emulsified using a homogenizer at 10,000 rpm. Thereafter, 40 g of water was added thereto and the solution was stirred at room temperature for 30 minutes and further at 40° C. for 3 hours. The solid content concentration of the thus-obtained microcapsule dispersion solution was 20% and the average particle size of microcapsules was 0.5 μm.

Example 1

Formation of Hydrophilic Layer

A coating solution for hydrophilic layer having the following composition was prepared, coated on the PET support having an undercoat layer obtained above by a bar coater to have a dry mass of 3.0 $g/m^2$, dried in an oven at 60° C. for 10 minutes, left standing under temperature and humidity conditions of 55° C. and 60% RH for 3 days, and then heated.

Composition of Coating Solution for Hydrophilic Layer

| | |
|---|---|
| A 4% aqueous solution of anionic surfactant (Nikkol OTP-100s, produced by Nikko Chemicals Co., Ltd.) | 0.24 g |
| Hydrophilic binder polymer solution (produced by the method described below) | 4.7 g |
| A 11% aqueous solution of hydrophobicizing precursor prepared above | 5.04 g |
| A 1.5% aqueous solution of light-heat converting substance (Dye IR-1 shown below) | 4.8 g |
| Water | 1.6 g |

Preparation Method of Hydrophilic Binder Polymer Solution

In 5.12 g of purified water and 8.14 g of ethyl alcohol, 1.23 g of tetramethoxysilane (LS540, produced by Shin-Etsu Silicone Co., Ltd.), 2.04 g of colloidal silica fine particle (a 20% aqueous solution of Snowtex C, produced by Nissan Chemicals Industries, Ltd.), 10.2 g of a 4% aqueous solution of Hydrophilic Organic Polymer (B-1) and 0.15 g of aluminum acetylacetonate were added and mixed by stirring at 60° C. for 2 hours. Thereafter, the solution was gradually cooled to room temperature to prepare a sol-gel solution.

(IR-1)

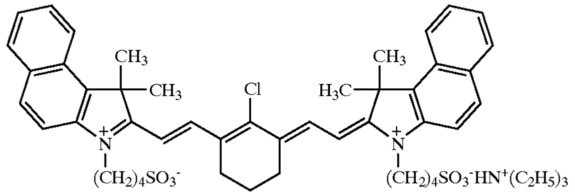

Formation of Surface Graft Layer

The surface of the hydrophilic layer formed above was subjected to an oxygen glow treatment using a plate magnetron sputtering apparatus (CFS-10-EP70, manufactured by Shibaura Eletec Corporation) under the following conditions.

Oxygen Glow Treatment Conditions

| | |
|---|---|
| Initial vacuum pressure: | $1.2 \times 10^{-3}$ Pa |
| Argon pressure: | 0.9 Pa |
| RF glow: | 1.4 KW |
| Treating time: | 60 seconds |

Then, the glow-treated film was immersed in a nitrogen bubbled aqueous acrylic acid solution (20%) at 60° C. for 4 hours. After the immersion, the film was washed with running water for 10 minutes to obtain Support S having a hydrophilic layer which surface was graft polymerized with an acrylic acid.

Formation of Image-Forming Layer

A coating solution for image-forming layer having the following composition was prepared. This coating solution was coated by means of a bar on Support S and dried in an oven at 90° C. for 120 seconds to obtain a lithographic printing plate precursor with an image-forming layer having a coated weight of 0.5 g/m$^2$.

Composition of Coating Solution for Image-forming Layer

| | |
|---|---|
| Water | 70 g |
| 1-Methoxy-2-propanol | 30 g |
| Microcapsule of Synthesis Example (1) (as solid content) | 5 g |
| Polyhydroxyethyl acrylate | 0.5 g |
| p-Diazodiphenylamine sulfate | 0.3 g |
| Light-heat converting substance (IR-1) | 0.3 g |

Evaluation of Lithographic Printing Plate Precursor

The thus-obtained lithographic printing plate precursor was exposed using Trendsetter 3244VFS (manufactured by Creo Co., Ltd.) where a water cooling 40 W infrared semiconductor laser was mounted, under the conditions such that the output was 9 W, the outer drum rotation number was 210 rpm, the plate surface energy was 100 mJ/cm$^2$ and the resolution was 2,400 dpi. Thereafter, without applying any treatment, the plate was fixed on a cylinder of printing machine SOR-M (manufactured by Hidelberg) and printing was performed by supplying a fountain solution and then ink and further feeding paper. The on-press development could be completed without problem and printing could be performed. The 5th printed matter after the initiation of printing was evaluated using a magnifier at a magnification of 20 times, as a result, background staining was not observed and the uniformity of density in the solid image area was very good. The printing was further continued and 15,000 sheets or more of good printed matters free of missing of fine lines or letters, unevenness in the density of solid image and staining in the non-image area were obtained.

Example 2

A lithographic printing plate precursor was produced in the same manner as in Example 1 except for using a support obtained by omitting the formation of the surface graft layer from Support S used in Example 1. This lithographic printing plate precursor was exposed and used for printing in the same manner as in Example 1. As a result, the printing plate precursor exhibited substantially acceptable on-press developability while a lower on-press developability than in Example 1, and 17,000 sheets or more of good printed matters free of missing of fine lines or letters, unevenness in the density of solid image and staining in the non-image area were obtained.

Comparative Example 1

A comparative lithographic printing plate precursor was produced in the same manner as in Example 1 except that the coating solution for hydrophilic layer used in the preparation of support of Example 1 was changed to the following coating solution containing no hydrophobicizing precursor.

Composition of Coating Solution for Hydrophilic Layer for Comparison

| | |
|---|---|
| A 4% aqueous solution of anionic surfactant (Nikkol OTP-100s, produced by Nikko Chemicals Co., Ltd.) | 0.24 g |
| Sol-gel solution for hydrophilic layer (same as that in Example 1) | 4.5 g |
| A 1.5% aqueous solution of light-heat converting substance (IR-1 shown in the present specification) | 4.4 g |

This lithographic printing plate precursor was exposed and used for printing in the same manner as in Example 1. As a result, although the ink staining in the non-image area of the printed matter was in a level of causing no problem in practice, missing of fine lines or letters was generated from the start of printing.

It is seen from these results that the lithographic printing plate precursor of the present invention is a good lithographic printing plate precursor having both staining resistance and long press life.

According to the present invention, a lithographic printing plate having good on-press developability, more improved in the staining resistance at printing, and ensuring sufficiently high strength of fine dot or line and a long press life can be provided, which can be used for printing by fixing it on a press as it is without performing any treatment after scan exposure based on digital signals.

The entire disclosure of each and every foreign patent application from which the benefit of foreign priority has been claimed in the present application is incorporated herein by reference, as if fully set forth.

What is claimed is:

1. A lithographic printing plate precursor comprising a water-resistant support, a hydrophilic layer and an image-forming layer, in this order, said hydrophilic layer comprising a fine particulate hydrophobicizing precursor and a hydrophilic binder polymer, and said image forming layer comprising a light-heat converting substance and a microcapsule encapsulating a hydrophobic substance, wherein the hydrophilic binder polymer is a composite material of a hydrophilic organic polymer and a polymer having a group including: at least one atom selected from a metal atom and semimetal atom; and an oxygen atom connecting with the at least one atom selected from a metal atom and semimetal atom.

2. The lithographic printing plate precursor as described in claim 1, wherein the hydrophilic organic polymer is (A) a hydrophilic organic polymer having a group capable of forming a hydrogen bond with the polymer having a group including: at least one atom selected from a metal atom and semimetal atom; and an oxygen atom connecting with the at least one atom selected from a metal atom and semimetal atom.

3. The lithographic printing plate precursor as described in claim 1, wherein the hydrophilic organic polymer is (B)

a hydrophilic organic polymer having a silane coupling group at the terminal, represented by the following formula (I):

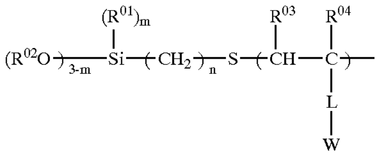

wherein $R^{01}$, $R^{02}$, $R^{03}$ and $R^{04}$ each independently represents a hydrogen atom or a hydrocarbon group having from 1 to 8 carbon atoms, m represents 0, 1 or 2, n represents an integer of 1 to 8, L represents a single bond or an organic linking group, W represents —$NHCOR^{05}$, —$CONH_2$, —$CON(R^{05})_2$, —$COR^{05}$, —OH, —$CO_2M$ or —$SO_3M$, and $R^{05}$ represents an alkyl group having from 1 to 8 carbon atoms, M represents a hydrogen atom, an alkali metal, an alkaline earth metal or an onium.

4. The lithographic printing plate precursor as described in claim 1, which further comprises a surface graft hydrophilic layer on the hydrophilic layer, the surface graft hydrophilic layer comprising a polymer compound having a hydrophilic functional group, wherein the polymer compound is chemically bonded to the surface of the hydrophilic layer.

5. The lithographic printing plate precursor as described in claim 4, wherein the polymer compound having a hydrophilic functional group is a linear polymer compound chemically bonded at the terminal of the polymer compound chain to the hydrophilic layer directly or through another binding polymer compound chemically bonded to the hydrophilic layer.

6. The lithographic printing plate precursor as described in claim 1, wherein the polymer having a group including: at least one atom selected from a metal atom and semimetal atom; and an oxygen atom connecting with the at least one atom selected from a metal atom and semimetal atom is a polymer obtained by the hydrolytic polycondensation of at least one compound represented by the following formula (II):

$$(R^0)_k M^0 (Y)_{z-k}$$

wherein $R^0$ represents a hydrogen atom, a hydrocarbon group or a heterocyclic group, Y represents a reactive group, $M^0$ represents a tri-, tetra-, quarter-, hepta- or hexa-valent metal or semimetal atom, z represents the valence number of $M^0$, and k represents 0, 1, 2, 3 or 4, provided that z-k is 2 or more.

7. The lithographic printing plate precursor as described in claim 1, wherein the fine particulate hydrophobicizing precursor includes a self water-dispersible hydrophobic resin fine particle having hydrophilic surface.

8. The lithographic printing plate precursor as described in claim 1, wherein the polymer having a group including: at least one atom selected from a metal atom and semimetal atom; and an oxygen atom connecting with the at least one atom selected from a metal atom and semimetal atom is a polymer having a group including: at least one semimetal atom; and an oxygen atom connecting with at least one semimetal atom.

9. The lithographic printing plate precursor as described in claim 1, wherein the metal atom and semimetal atom is at least one of transition metals, rare earth metals, metals and semimetals of Groups III to V of the periodic table.

10. The lithographic printing plate precursor as described in claim 1, wherein the metal atom and semimetal atom is at least one of Al, Si, Sn, Ge, Ti and Zr.

11. The lithographic printing plate precursor as described in claim 1, wherein the metal atom and semimetal atom is at least one of Al, Si, Sn, Ti and Zr.

12. The lithographic printing plate precursor as described in claim 1, wherein the metal atom and semimetal atom is Si.

* * * * *